(12) United States Patent
Crocco et al.

(10) Patent No.: US 9,773,836 B1
(45) Date of Patent: Sep. 26, 2017

(54) METHOD AND FUNCTIONAL ARCHITECTURE FOR INLINE REPAIR OF DEFECTIVE LITHOGRAPHICALLY MASKED LAYERS

(71) Applicant: DPIX, LLC, Colorado Springs, CO (US)

(72) Inventors: Jerome David Crocco, Colorado Springs, CO (US); Geun Jo Han, Colorado Springs, CO (US); Michael Robert Johnson, Colorado Springs, CO (US)

(73) Assignee: dpiX, LLC, Colorado Springs, CO (US)

( * ) Notice: Subject to any disclaimer, the term of this patent is extended or adjusted under 35 U.S.C. 154(b) by 0 days.

(21) Appl. No.: 15/374,696

(22) Filed: Dec. 9, 2016

Related U.S. Application Data

(60) Provisional application No. 62/496,997, filed on Nov. 4, 2016.

(51) Int. Cl.
*H01L 27/146* (2006.01)
*H01L 21/66* (2006.01)
*H01L 31/0224* (2006.01)
*G02F 1/1362* (2006.01)

(52) U.S. Cl.
CPC ........ *H01L 27/14698* (2013.01); *H01L 22/20* (2013.01); *H01L 27/14603* (2013.01); *H01L 27/14692* (2013.01); *G02F 1/136259* (2013.01); *G02F 2001/136263* (2013.01); *H01L 31/022408* (2013.01); *H01L 31/022475* (2013.01); *H01L 31/022483* (2013.01)

(58) Field of Classification Search
CPC ........ H01L 27/14698; H01L 27/14603; H01L 27/14692; H01L 27/14605; H01L 22/20; H01L 22/22; G02F 1/136259; G02F 1/1309; G02F 2001/136263
See application file for complete search history.

(56) References Cited

U.S. PATENT DOCUMENTS

| | | | | |
|---|---|---|---|---|
| 5,616,524 A * | 4/1997 | Wei | .................... | H01L 21/76892 257/E21.595 |
| 7,902,512 B1 * | 3/2011 | Chang | ............... | H01L 27/14603 250/370.01 |
| 8,021,935 B2 * | 9/2011 | Mei | ..................... | H01L 27/1214 257/E21.023 |
| 8,262,427 B2 * | 9/2012 | Oka | ..................... | B23K 26/032 438/4 |

(Continued)

*Primary Examiner* — Michael Trinh
(74) *Attorney, Agent, or Firm* — Slater Matsil, LLP

(57) ABSTRACT

A method of manufacturing an sensor array includes providing a glass substrate; forming a bottom electrode layer over the glass substrate; forming a sensor material layer over the bottom electrode layer; forming a top electrode layer over the sensor material layer; patterning the top electrode layer, the sensor material layer, and the bottom electrode layer using a first photoresist layer to form a plurality of pixels; detecting a defect in the plurality of pixels; and patterning the plurality of pixels using a second photoresist layer. The first photoresist layer includes a plurality of first pixel patterns and the second photoresist layer comprises a plurality of second pixel patterns, and wherein at least one of the second pixel patterns has an area greater than that of a corresponding first pixel pattern.

20 Claims, 38 Drawing Sheets

(56) References Cited

U.S. PATENT DOCUMENTS

2011/0291090 A1* 12/2011 Sugawara ....... H01L 31/022408
  257/53
2014/0291743 A1* 10/2014 Miyamoto ........ H01L 27/14612
  257/292

* cited by examiner

METHOD AND FUNCTIONAL ARCHITECTURE FOR INLINE REPAIR OF DEFECTIVE LITHOGRAPHICALLY MASKED LAYERS

RELATED APPLICATIONS

The present application relates to and claims priority of U.S. provisional patent application ("Provisional Application"), Ser. No. 62/496,997, filed on Nov. 4, 2016. The disclosure of the Provisional Application is hereby incorporated by reference in its entirety.

BACKGROUND OF THE INVENTION

1. Field of the Invention

The present invention generally relates to imaging sensor arrays, and, more particularly, to a method for manufacturing and repairing the imaging sensor arrays.

2. Relevant Background

Imaging sensor arrays, or sensor arrays, are known in the art and are typically manufactured using techniques similar to those known in the semiconductor industry. The steps of the manufacturing method are carried out using modern quality control measures. However, defects in the manufacturing method can and do occur despite the quality control measures. Ail of the sensor arrays are tested, and the defective arrays can either be scrapped or repaired. If a sensor array is scrapped, this obviously has a detrimental effect on the profit margin associated with the imaging array. Yield improvement can be realized using repair techniques such as laser repair. Laser repair can involve the physical ablation of layers and structures in the sensor array that may cause even further damage. Therefore, while laser repair may sometimes be used, the effectiveness of this approach can be marginal.

What is desired is an inline method of repairing a defect in the sensor array during the manufacturing method that is effective for repairing the defect, but does not cause further damage, is cost effective, and makes a positive contribution to yield enhancement of the manufacturing method.

SUMMARY OF THE INVENTION

In a first embodiment of the present invention, a method of manufacturing a sensor array comprises providing a glass substrate; forming a bottom electrode layer over the glass substrate; forming a sensor material layer over the bottom electrode layer; forming a top electrode layer over the sensor material layer; patterning the top electrode layer, the sensor material layer, and the bottom electrode layer using a first photoresist layer to form a plurality of pixels; detecting a defect in the plurality of pixels; and patterning the plurality of pixels using a second photoresist layer.

The first photoresist layer comprises a plurality of first pixel patterns and the second photoresist layer comprises a plurality of second pixel patterns, and wherein at least one of the second pixel patterns has an area greater than that of a corresponding first pixel pattern.

The defect in the plurality of pixels comprises an artifact in the bottom electrode layer connecting two pixels, an artifact in the sensor material layer connecting two pixels, or an artifact in the top electrode layer connecting two or more pixels.

The bottom electrode layer comprises chromium, the sensor material layer comprises amorphous silicon, and the top electrode layer comprises Indium Tin Oxide.

The method according to the first embodiment of the invention further comprises forming a metal layer over the plurality of pixels, which can comprise aluminum. The method further comprises patterning the metal layer using a third photoresist layer to form a plurality of data lines coupled to the plurality of pixels, detecting a defect in the plurality of data lines, and patterning the plurality of data lines using a fourth photoresist layer. The third photoresist layer comprises a plurality of first patterns and the fourth photoresist layer comprises a plurality of fourth patterns, and wherein at least one of the fourth patterns has an area greater than that of a corresponding third pattern.

In a second embodiment of the present invention, a method of manufacturing a sensor array comprises providing a glass substrate; forming a bottom electrode layer over the glass substrate; forming a sensor material layer over the bottom electrode layer; forming a top electrode layer over the sensor material layer; patterning the top electrode layer, the sensor material layer, and the bottom electrode layer using a first photoresist layer to form a plurality of pixels; forming a metal layer over the plurality of pixels; patterning the metal layer using a first photoresist layer to form a plurality of data lines coupled to the plurality of pixels; detecting a defect in the plurality of data lines; and patterning the plurality of data lines using a second photoresist layer.

The first photoresist layer comprises a plurality of first patterns and the second photoresist layer comprises a plurality of second patterns, and wherein at least one of the second patterns has an area greater than that of a corresponding first pattern. The defect in the plurality of data lines comprises an artifact in the metal layer connecting two data lines.

The manufacturing process of a sensor array is comprised of a series of cycles wherein thin films of material are deposited onto a substrate, and a protective lithographic mask is applied to the deposited material, and the remaining material not covered by the mask is subsequently removed or etched. This process of thin film deposition, lithographic coating, and etching, results in a thin film of material whose geometry is determined by the design of the lithographic mask. The use of various lithographic masks in conjunction with a wide range of electronic materials provides a capacity to form complex device architectures with characteristics suitable for various applications.

The above-mentioned processes are implemented to create sensor features with dimensions less than one millimeter, and often much smaller. At this micro- and sub-microscopic level, objects such as particles, flakes, or dust begin to impact on the congruence between the physical dimensions of the feature and its lithographic design. For example, particles may fall on the substrate during thin film deposition causing defects in the material. Alternatively, the particles may block or absorb the lithographic masking layer causing the mask to spread across the film, effectively distorting the geometry of the feature. Finally, these micron and submicron size particles may physically block the etching process, effectively acting as a mask and leaving behind material where the material should have been removed. As a consequence, the final morphology/topography of the feature does not correspond to the intended design, and often results in device failure.

For decreasing feature sizes and for increasing array areas, this issue becomes a major obstacle to achieving a high yield of functional products. The method of the present invention is used to implement a repair step that removes the remnant material (i.e., particles, flakes, or residue) that has obstructed during the lithographic or etching phases of the manufacturing cycle.

The method of the present invention comprises (1) a cleaning step to remove resident particles, (2) a second lithographic mask to coat/protect the features of interest, and (3) a second etching step to remove excess material which has been obstructed by particulate matter previously. Furthermore, the architecture of the device may include an integrated etch stop to prevent over etching of the substrate. It should be noted, that the design of the method of the present invention relies upon the location of a particle on a plate being derived from a random natural process. Therefore, it is assumed that particles will not likely interfere with the same feature twice.

Those defects that have the strongest impact on product yield arise from physical or chemical obstructions that block an etching step, and impede the material from being etched or removed properly. This type of defect is referred to as an "etch block" and may arise from environmental contamination such as particles and flakes, or by a malfunctioning tool leaving residual particulate matter on the surface of the film.

As a consequence, etch blocks mask the thin film during the etching step, leaving behind a thin film of metal or semiconductor, for example, where it should not be. During the etching process, if a particle or flake has fallen onto the plate, and is not removed, an undesirable corresponding thin film of material associated with one or more sensor layers can be formed. As a result, pixels or data lines can be shorted together, producing a large cluster defect compromising the performance of several neighboring pixels, which is totally unacceptable for a commercial application of the image sensor device.

DETAILED DESCRIPTION OF THE PREFERRED EMBODIMENTS

Figure 1A:
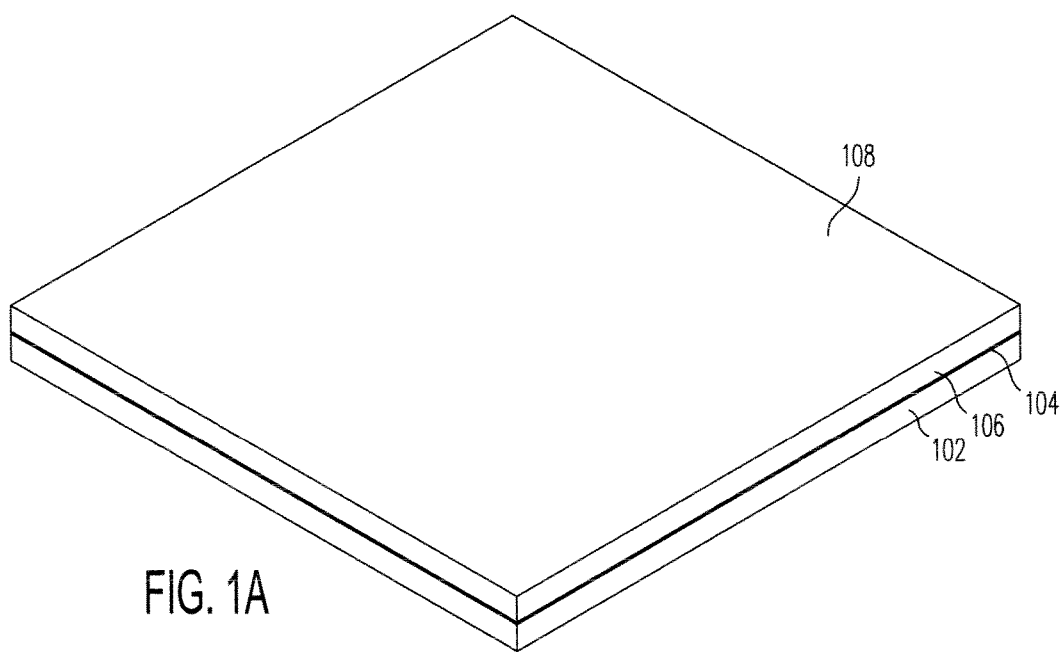
FIGS. 1A-1D illustrate, in cross-sectional and plan views, a manufacturing method of an image sensor device wherein no defects are detected according to the present invention.
Figure 1B:
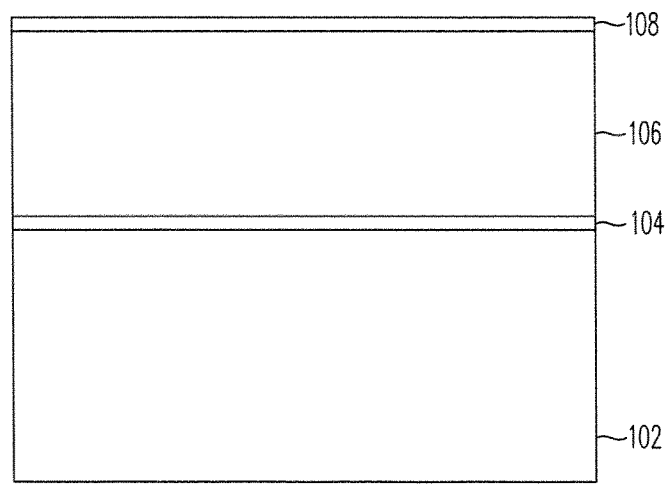
Figure 1C:
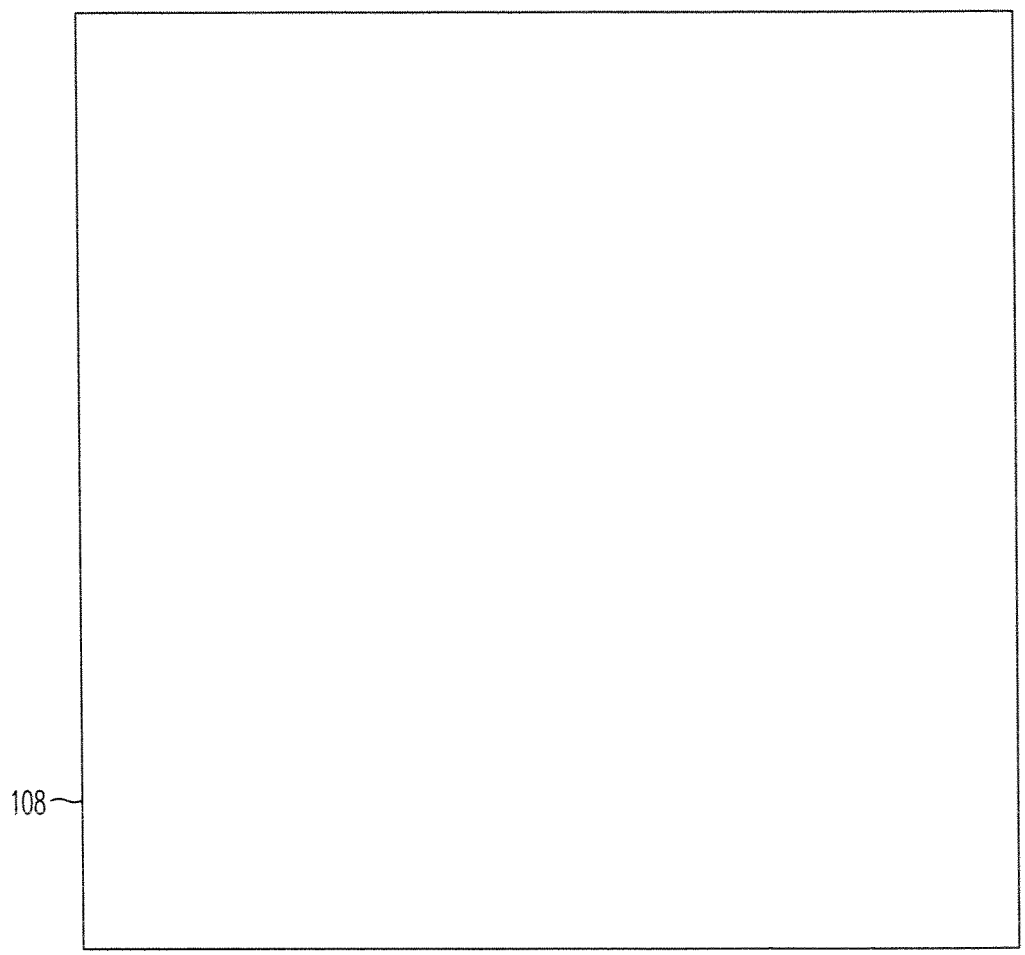
Figure 1D:
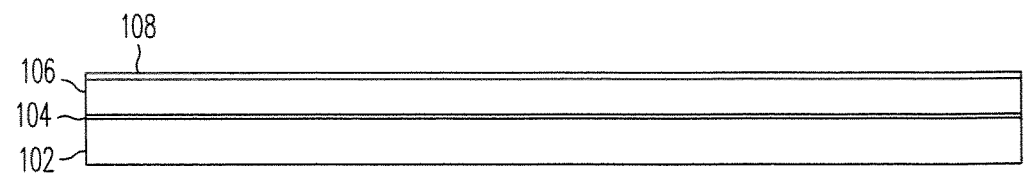
Figure 2A:
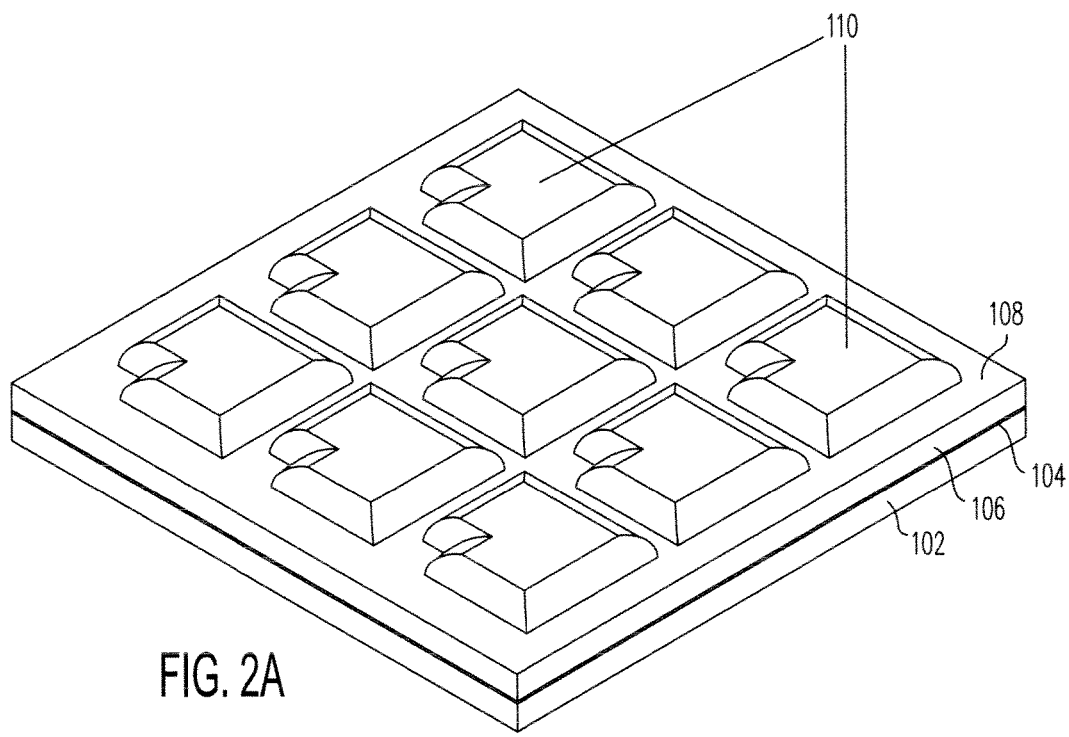
FIGS. 2A-2D illustrate, in cross-sectional and plan views, a manufacturing method of an image sensor device wherein no defects are detected according to the present invention.
Figure 2B:
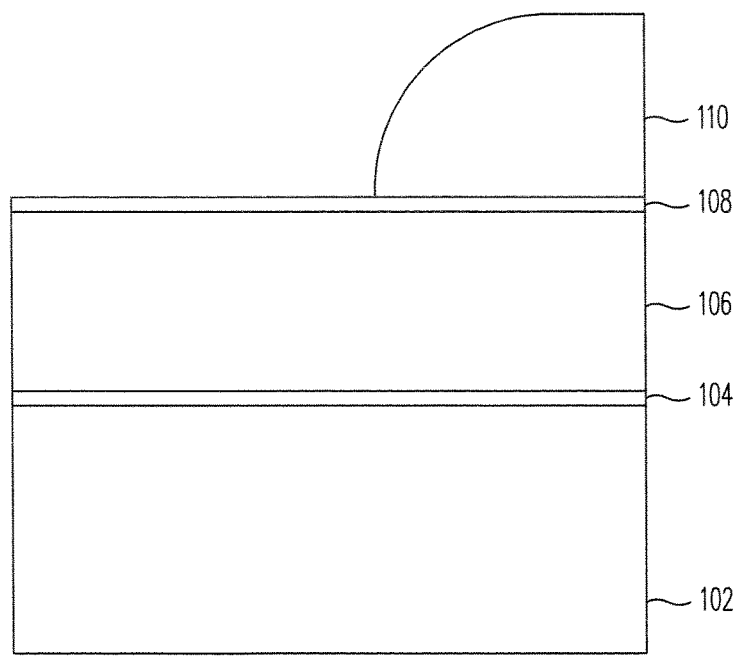
Figure 2C:
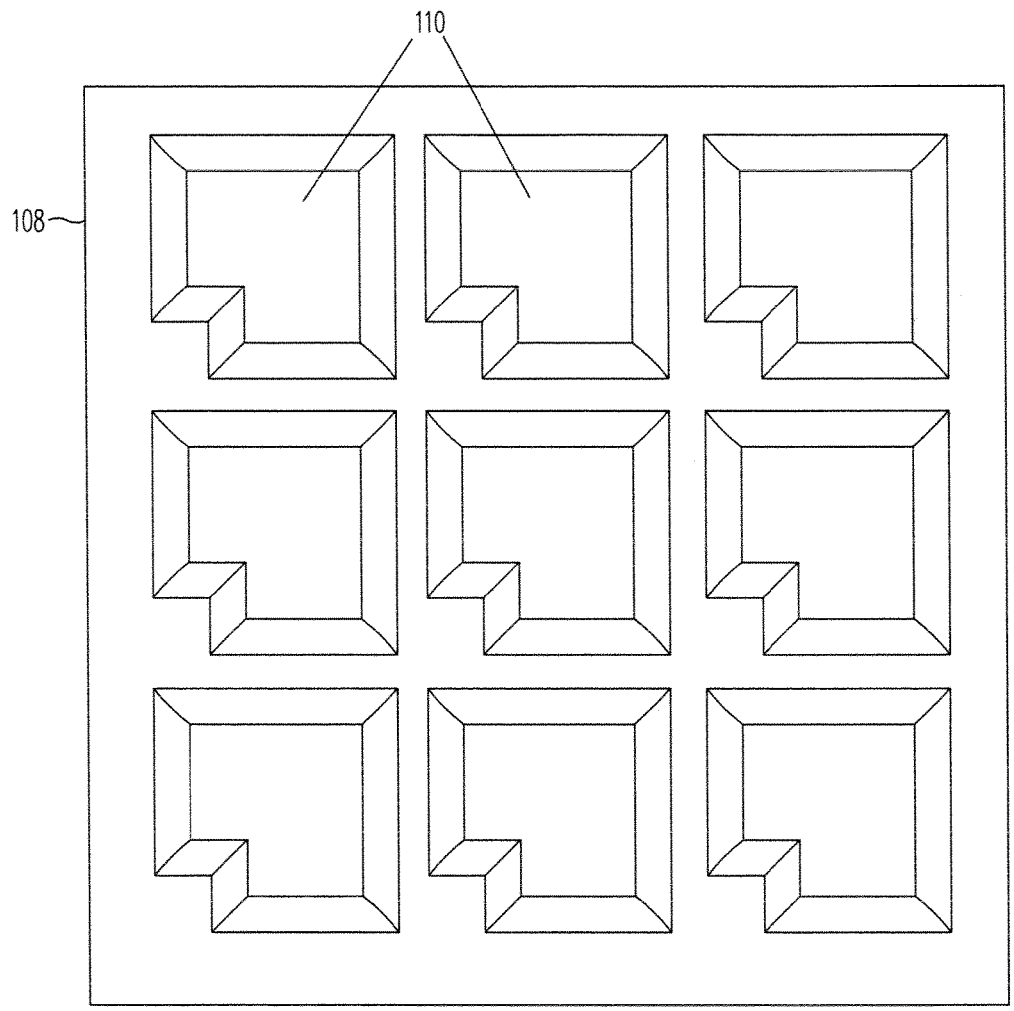
Figure 2D:
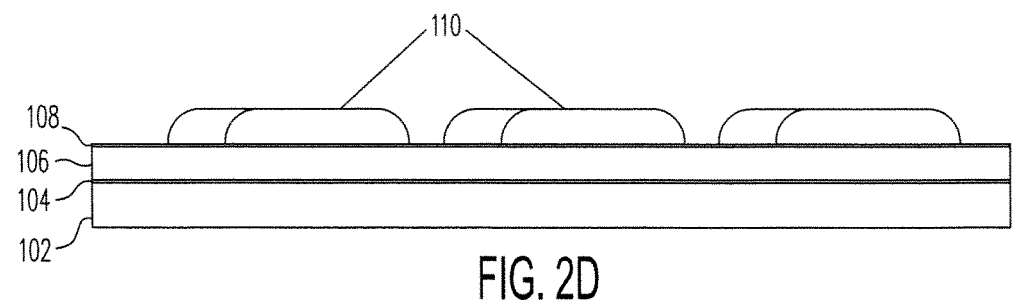
Figure 3A:
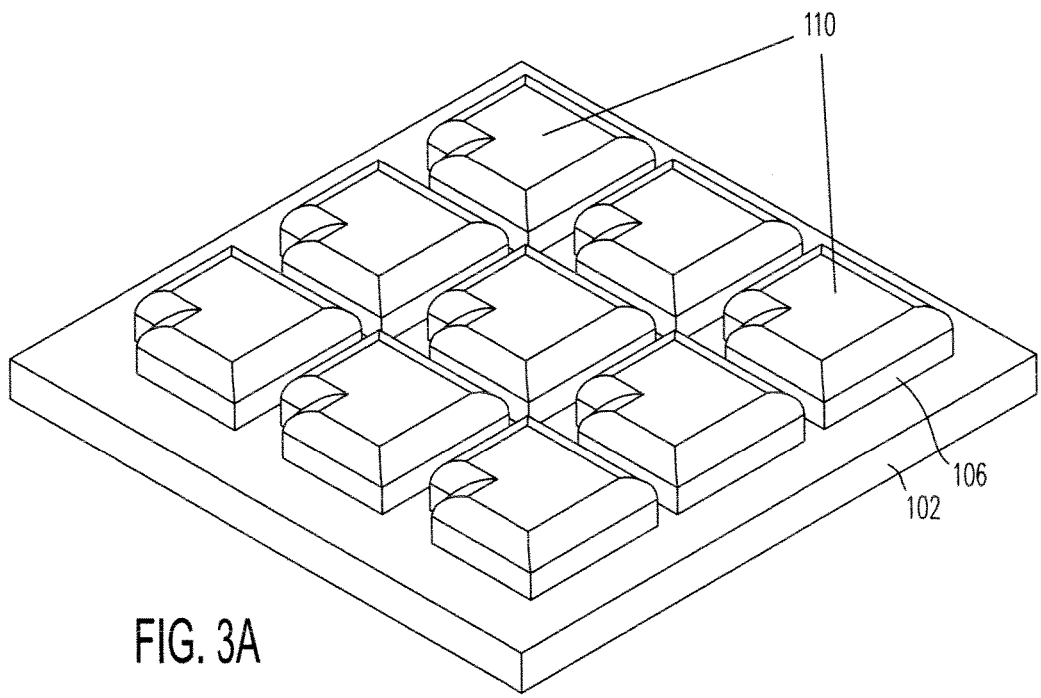
FIGS. 3A-3D illustrate, in cross-sectional and plan views, a manufacturing method of an image sensor device wherein no defects are detected according to the present invention.
Figure 3B:
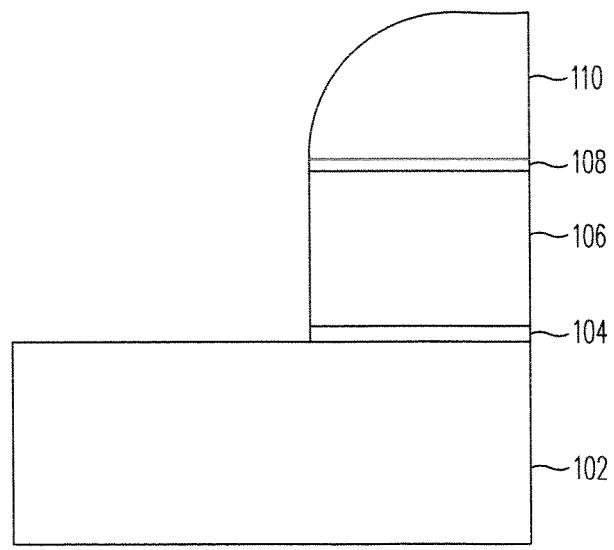
Figure 3C:
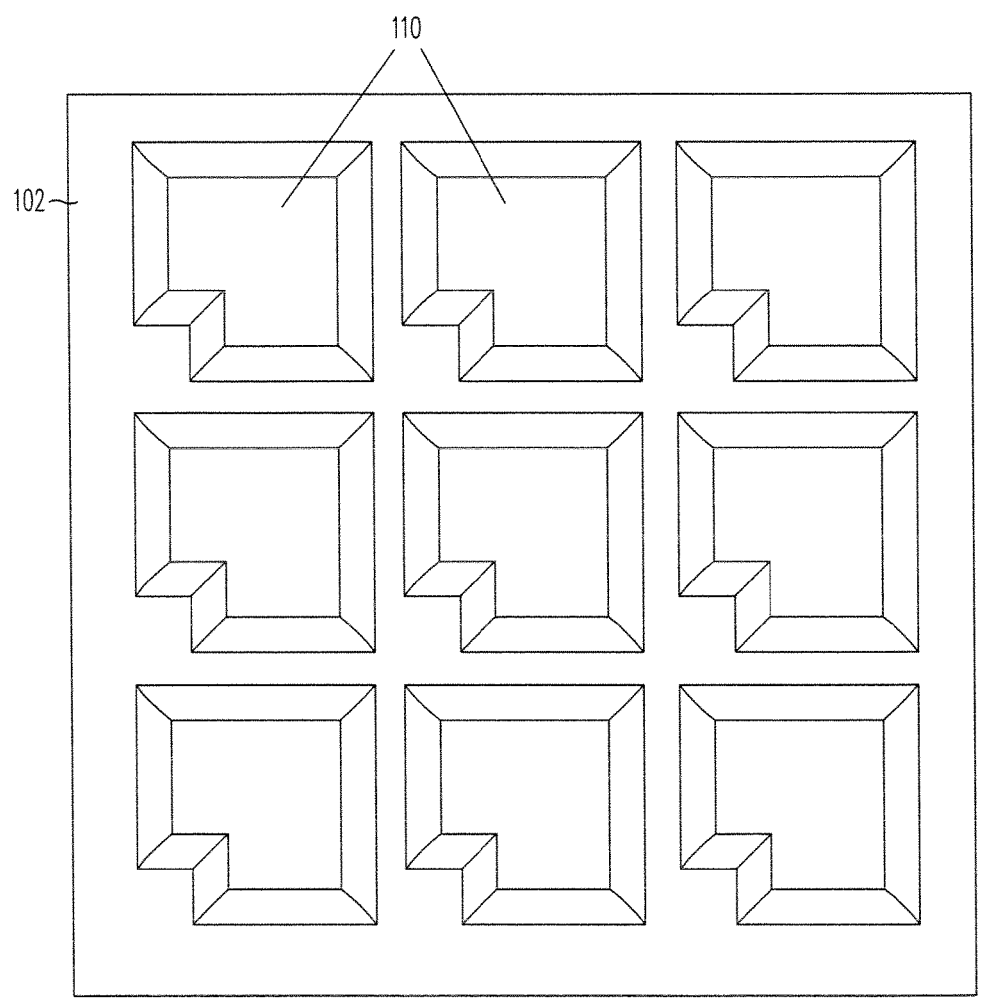
Figure 3D:
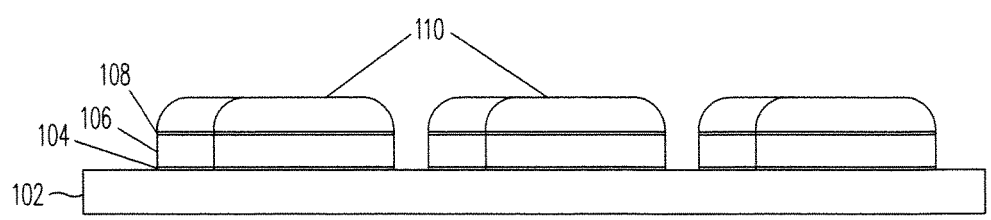
Figure 4A:
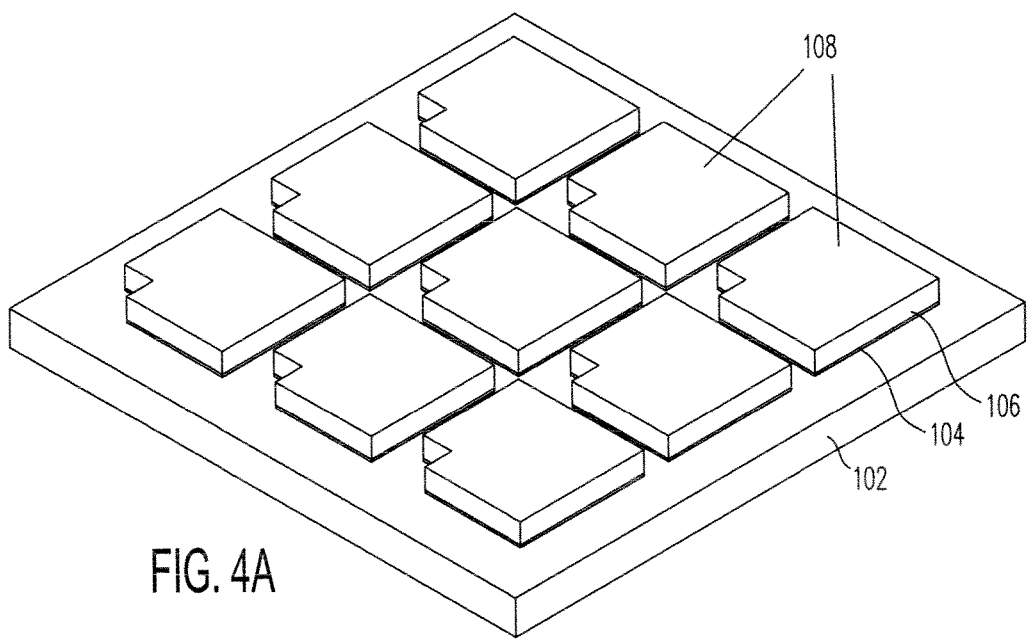
FIGS. 4A-4D illustrate, in cross-sectional and plan views, a manufacturing method of an image sensor device wherein no defects are detected according to the present invention.
Figure 4B:
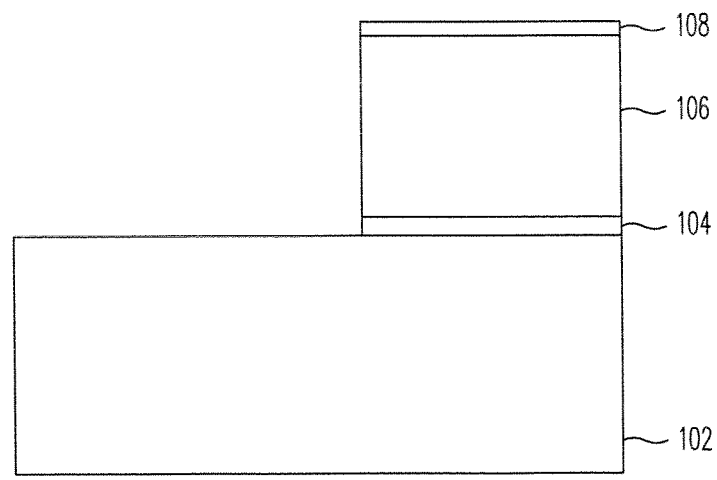
Figure 4C:
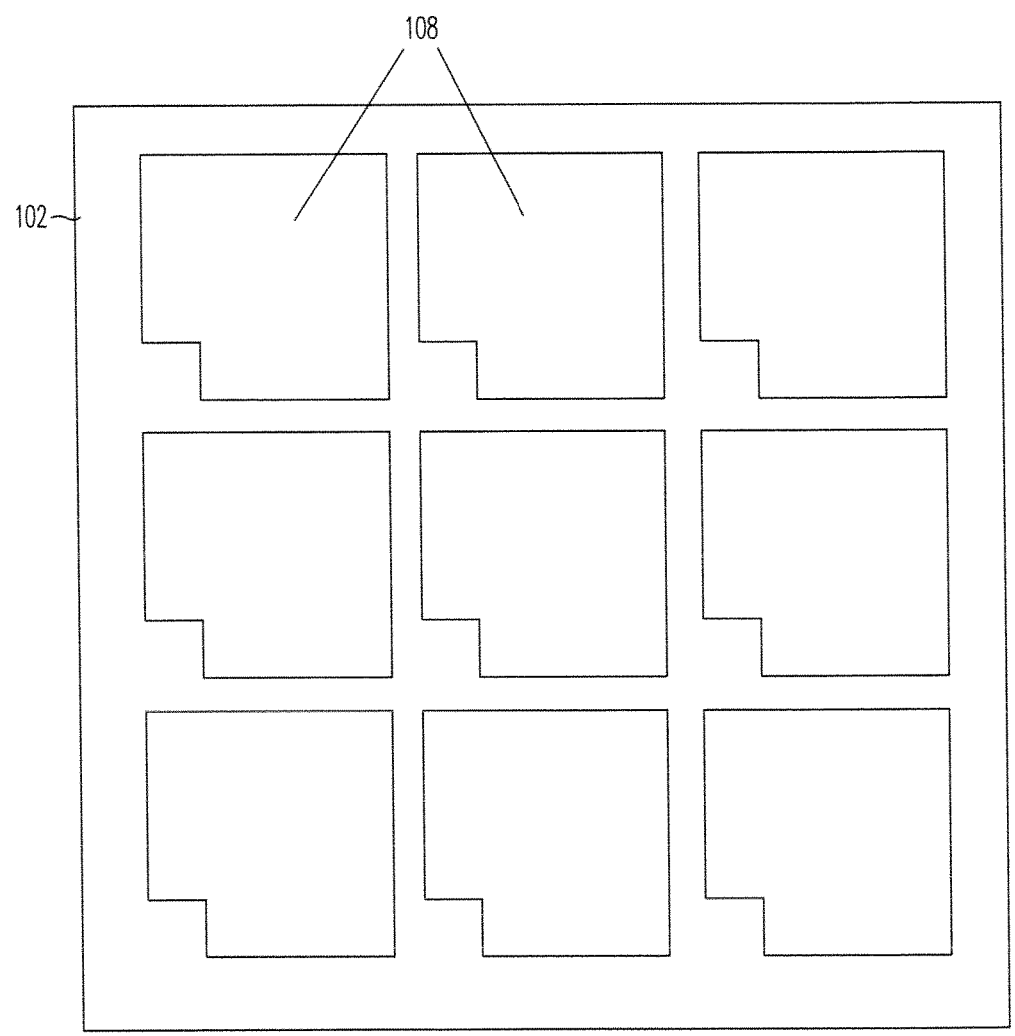
Figure 4D:
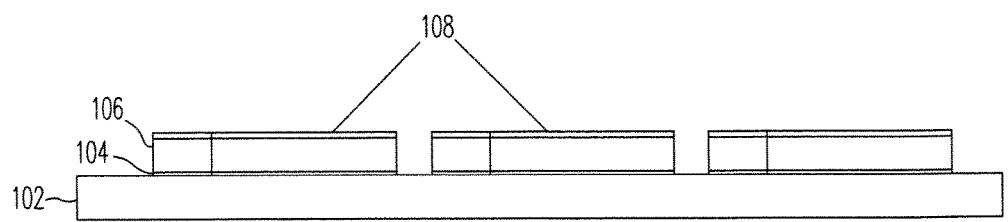
Figure 5A:
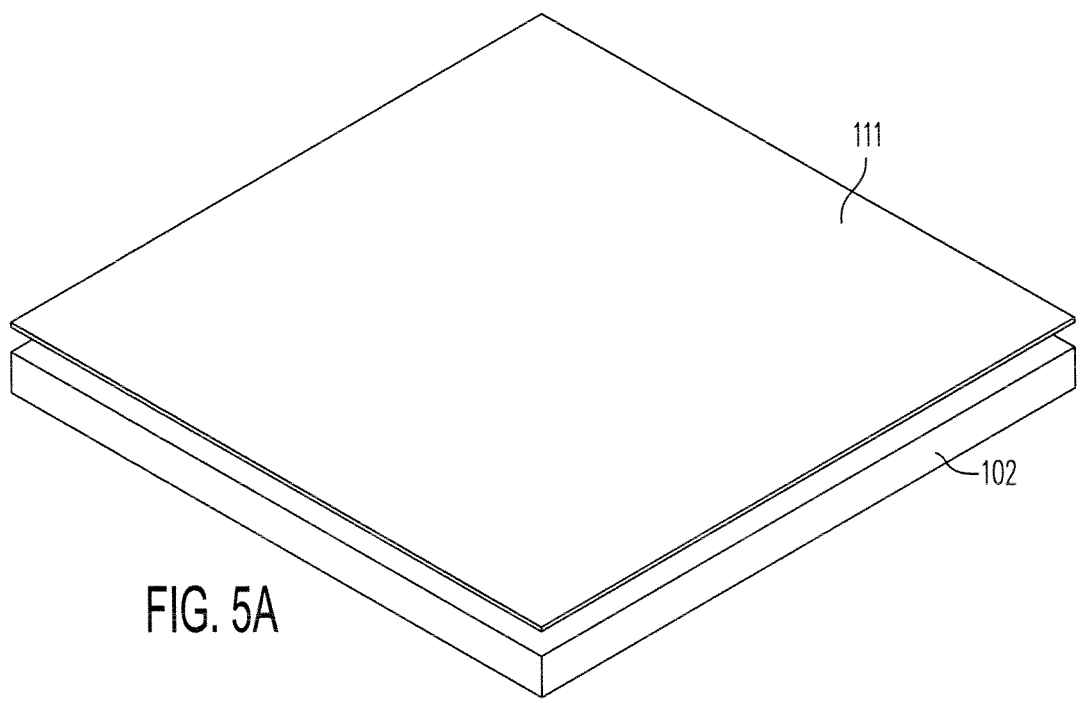
FIGS. 5A-5D illustrate, in cross-sectional and plan views, a manufacturing method of an image sensor device wherein no defects are detected according to the present invention.
Figure 5B:
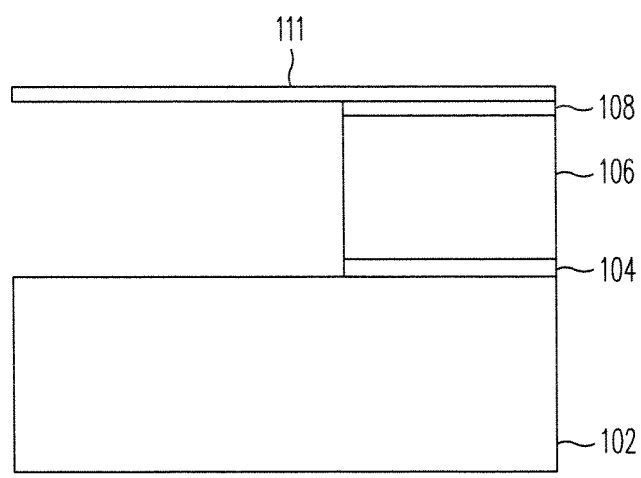
Figure 5C:
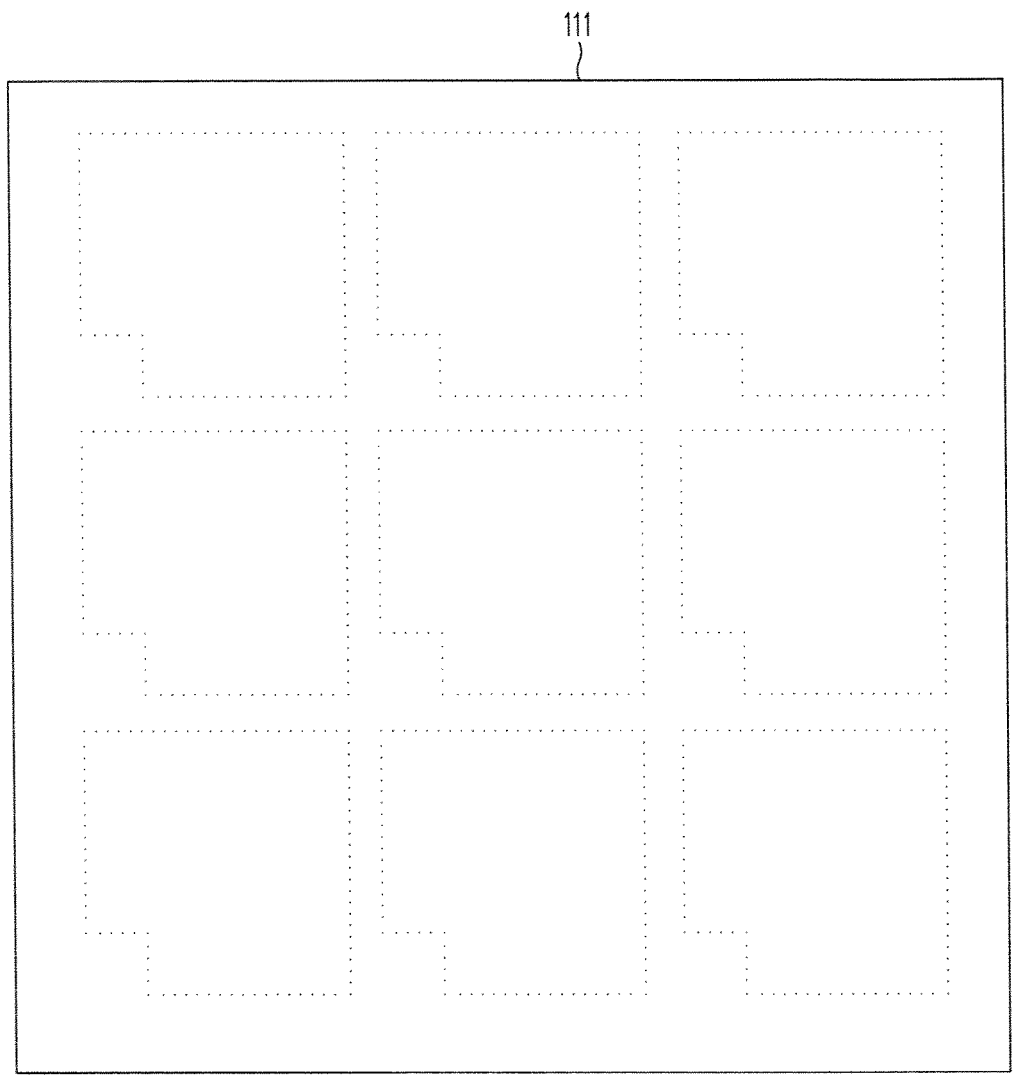
Figure 5D:
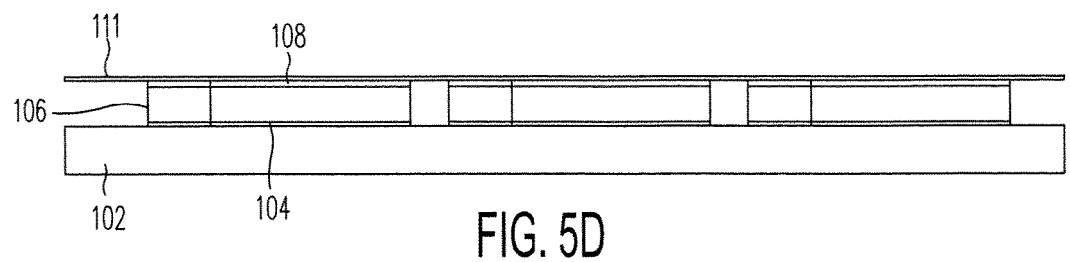
Figure 6A:
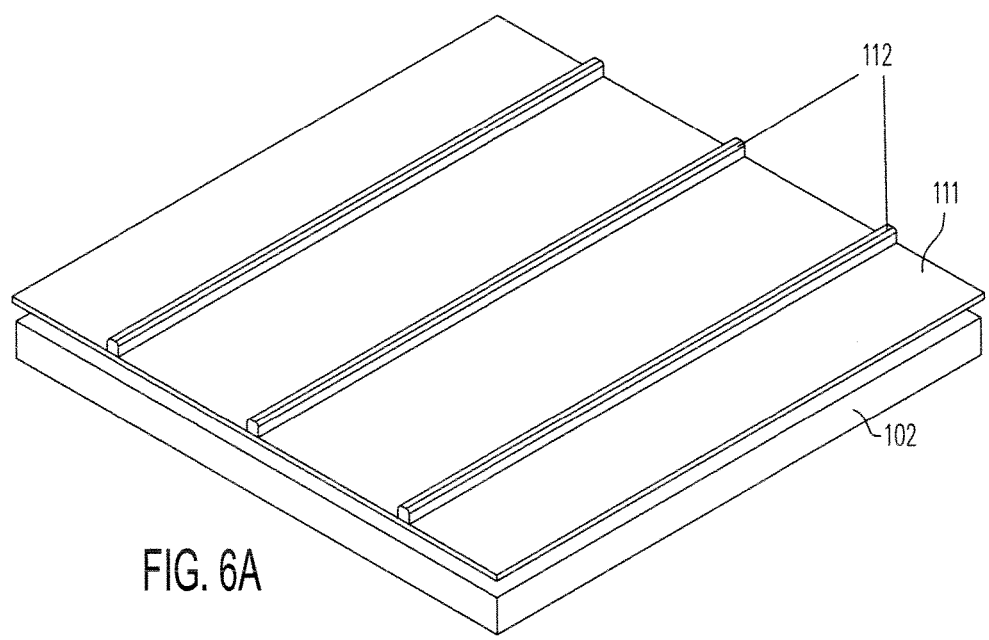
FIGS. 6A-6D illustrate, in cross-sectional and plan views, a manufacturing method of an image sensor device wherein no defects are detected according to the present invention.
Figure 6B:
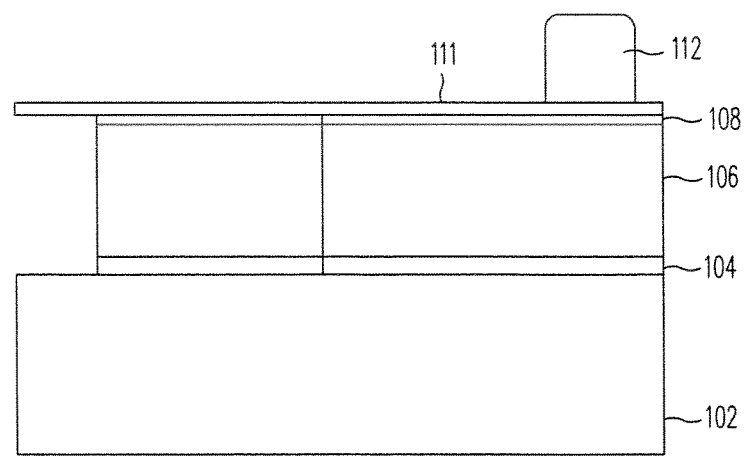
Figure 6C:
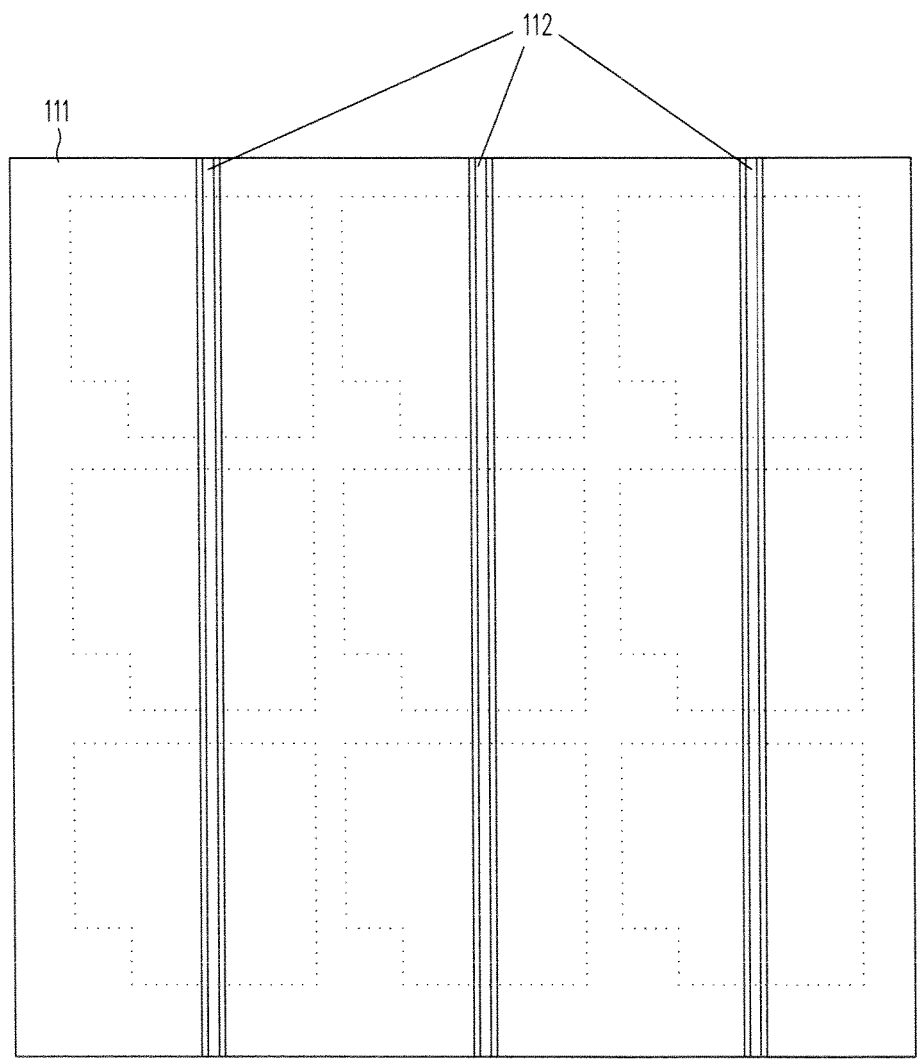
Figure 6D:
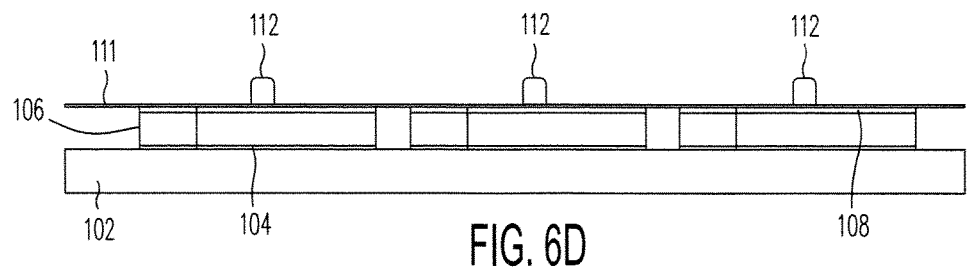
Figure 7A:
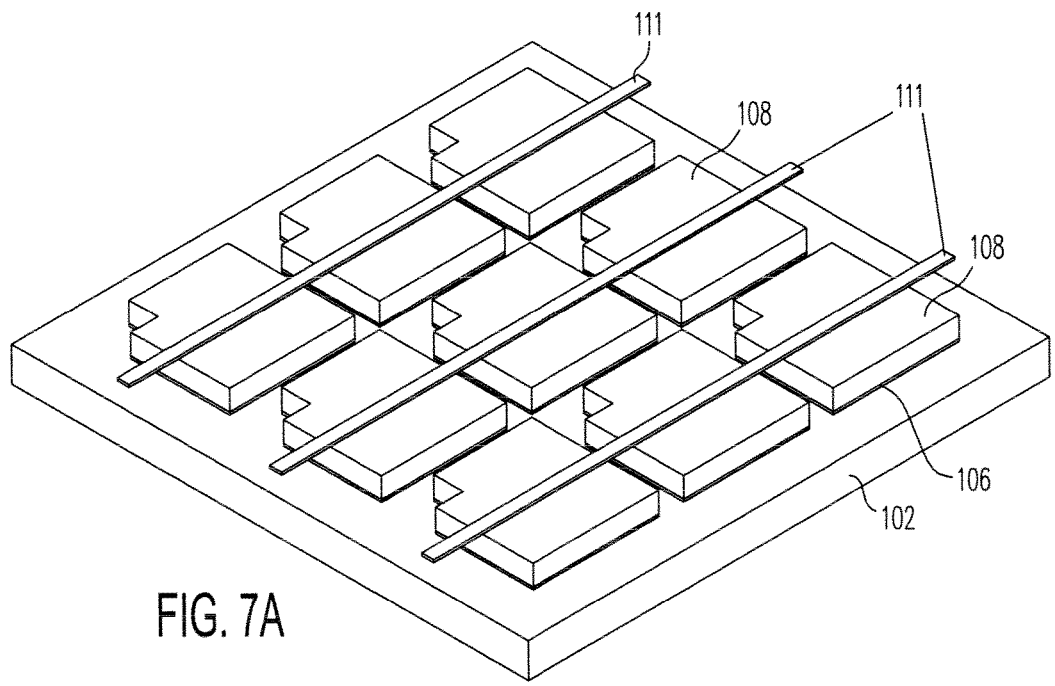
FIGS. 7A-7D illustrate, in cross-sectional and plan views, a manufacturing method of an image sensor device wherein no detects are detected according to the present invention.
Figure 7B:
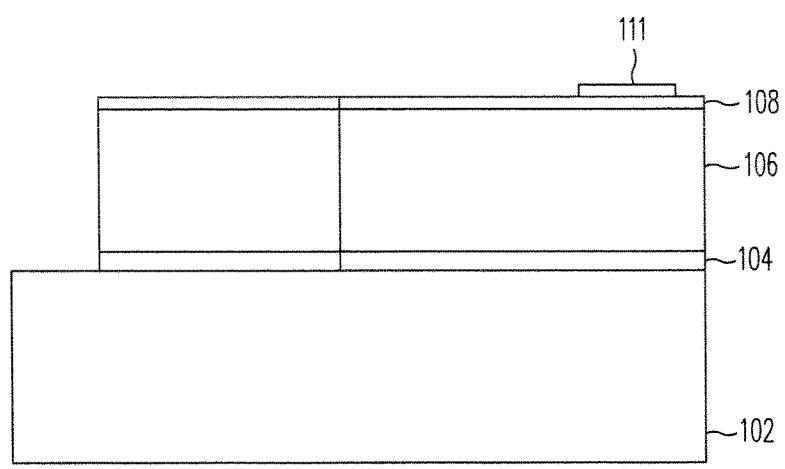
Figure 7C:
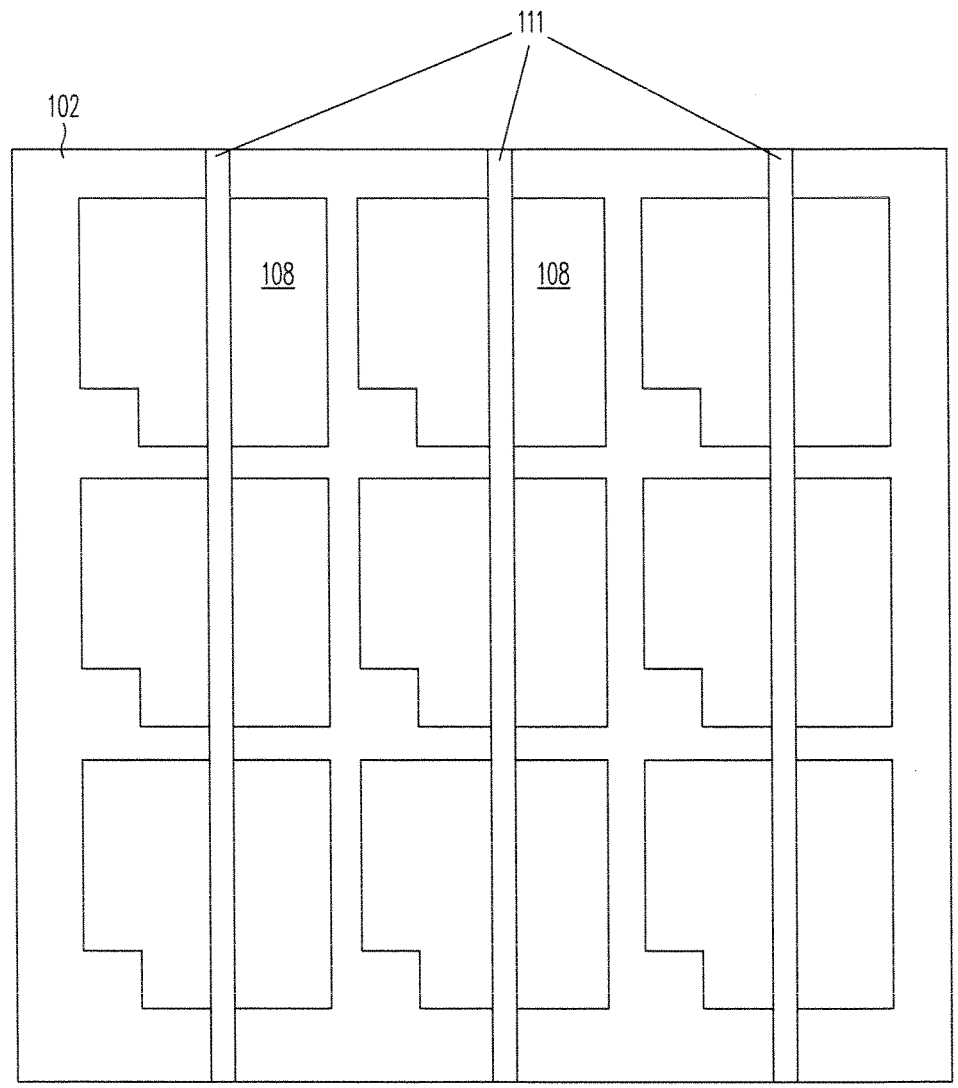
Figure 7D:
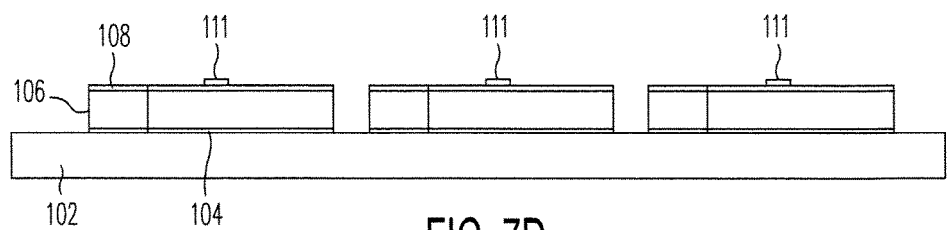

FIGS. 1A-7D illustrate, in cross-sectional and plan views, a manufacturing method of an image sensor device wherein no defects are detected according to the present invention.

Referring to FIGS. 1A-1D, the method of manufacturing an image sensor device comprises providing a glass substrate 102, which is typically formed of glass or plastic, although other materials can be used. The typical thickness of the substrate 102 is typically between 0.3 and 1 mm thick. A bottom electrode layer 104 is formed over the glass substrate 102 using, for example, techniques such as Physical Vapor Deposition (PVD) i.e. thermal evaporation, sputter deposition, pulsed laser deposition. The bottom electrode layer 104 is typically chromium or molybdenum. The typical thickness of the bottom electrode layer 104 is between 50 and 300 nm thick. A sensor material layer 106 is formed over the bottom electrode layer 104, using, for example, techniques such as Plasma Enhanced Chemical Vapor Deposition (PECVD). The sensor material layer 106 is typically amorphous silicon, but other materials such as amorphous selenium or crystalline silicon can also be used. The typical thickness of the sensor material layer 106 is between 0.5 and 2 μm thick, depending upon the exact material used and the applications requirements. A top electrode layer 108 is formed over the sensor material layer 106 using, for example, techniques such as PVD. The top electrode layer 108 is typically Indium Tin Oxide, but other transparent electrodes such as Aluminum Zinc Oxide (AZO) or Indium Zinc Oxide (IZO) may be used. The typical thickness of the top electrode 108 is between 50 and 3.00 nm thick.

Referring to FIGS. 2A-2D, the top electrode layer 108, the sensor material layer 106, and the bottom electrode layer 104 are shown before being patterned using a first photoresist layer 110 to form a plurality of pixels. In FIGS. 2A-2D the patterned photoresist layer 110 is shown including a plurality of pixel photoresist patterns. Photoresist layer 110 can be made of conventional photoresist materials and is typically about 1-3 µm thick.

Referring to FIGS. 3A-3D the top electrode layer 108, the sensor material layer 106, and the bottom electrode layer 104 are shown after being patterned using the first photoresist layer 110 to form the plurality of pixels. Etching can be performed using either wet chemical or dry plasma etching techniques.

Referring to FIGS. 4A-4D, the photoresist layer 110 has been removed showing the plurality of pixels each containing an etched bottom electrode layer 104, an etched sensor material layer 106, and an etched top electrode layer 108.

Referring to FIGS. 5A-5D, a blanket metal layer 111 is formed over the plurality of pixels of the partially formed sensor array. The metal layer 111 typically comprises aluminum, and is between 1,000 and 10,000 nm thick. The metal layer 111 can be formed using techniques such as PVD.

Referring to FIGS. 6A-6D, a photoresist layer 112 is formed over the metal layer 111 to form data lines. FIGS. 6A-6D show the metal layer 111 before the data lines are formed, and the patterned photoresist layer 112. Photoresist layer 112 can be made of conventional photoresist materials and is typically about 1-3 µm thick.

Referring to FIGS. 7A-7D, the metal layer is etched to form individual data lines 111. The photoresist layer 112 is removed in FIGS. 7A-7D. Note also that each data line 111 is coupled to each of the individual pixels in FIGS. 7A-7D.

The manufacturing method of the present invention is completed in FIGS. 7A-7D. In FIGS. 1A-7D as presented no manufacturing defects have been noted. An inspection can be performed after each manufacturing method step. No repairs are necessary in FIGS. 1A-7D because there are no defects to be repaired.

Figure 8A:
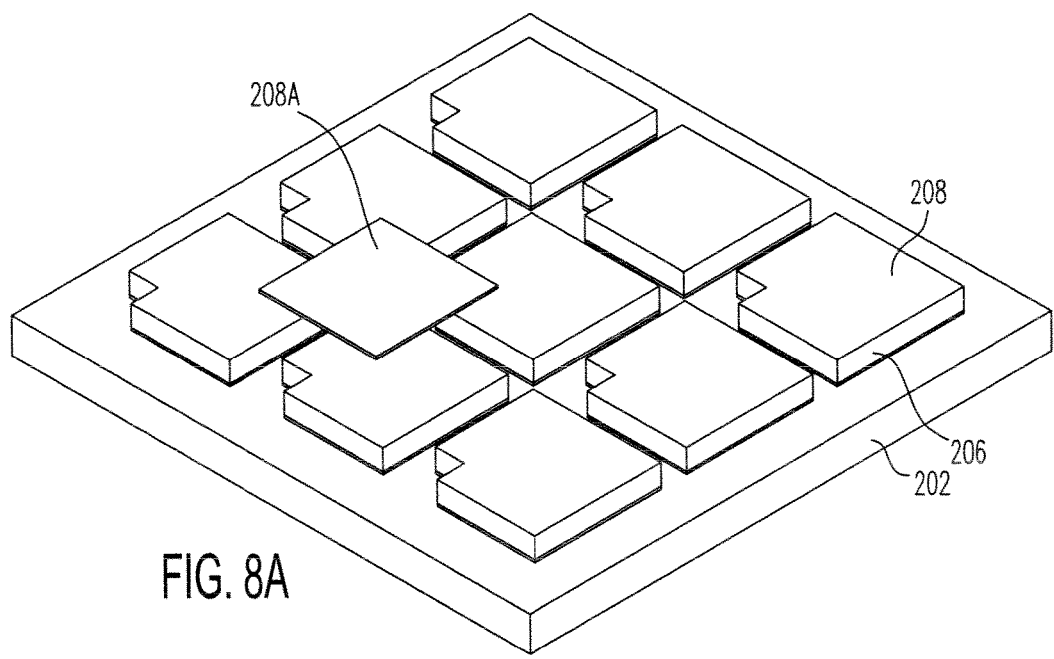
FIGS. 8A-8D illustrate, in cross-sectional and plan views, an inline repair of a first defect in the manufacturing method according to the present invention.
Figure 8B:
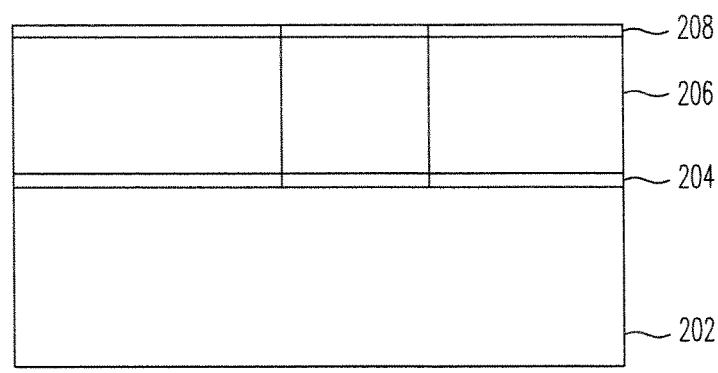
Figure 8C:
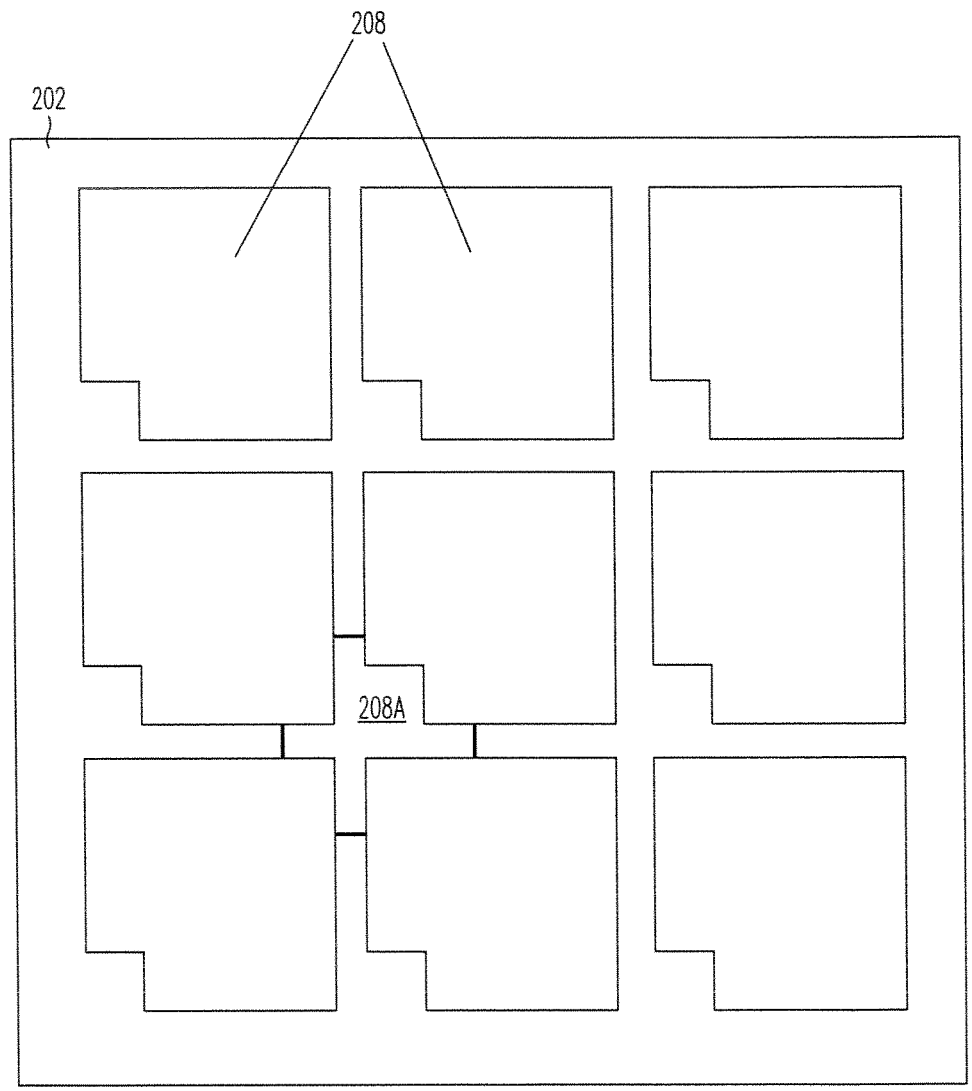
Figure 8D:
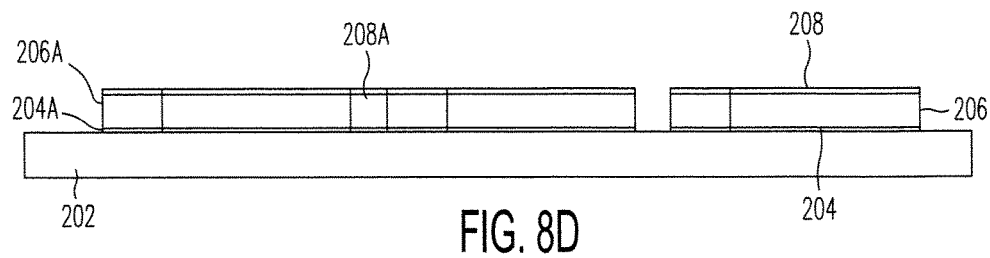

Referring to FIGS. 8A-8D, the substrate 202, bottom electrode layer 204, sensor material layer 206, and a top electrode layer 208 are shown. Note that in FIGS. 8A-8D a defect 208A has been detected. In the example of FIGS. 8A-8D, the defect implicates all three layers 204, 206, and 208. If left in this state, the image sensor would have to be scrapped or repaired. In the example of FIGS. 8A-8D, the defect 208A couples a defective pixel to three neighboring pixels through all three layers 204, 206, and 208.

Figure 9A:
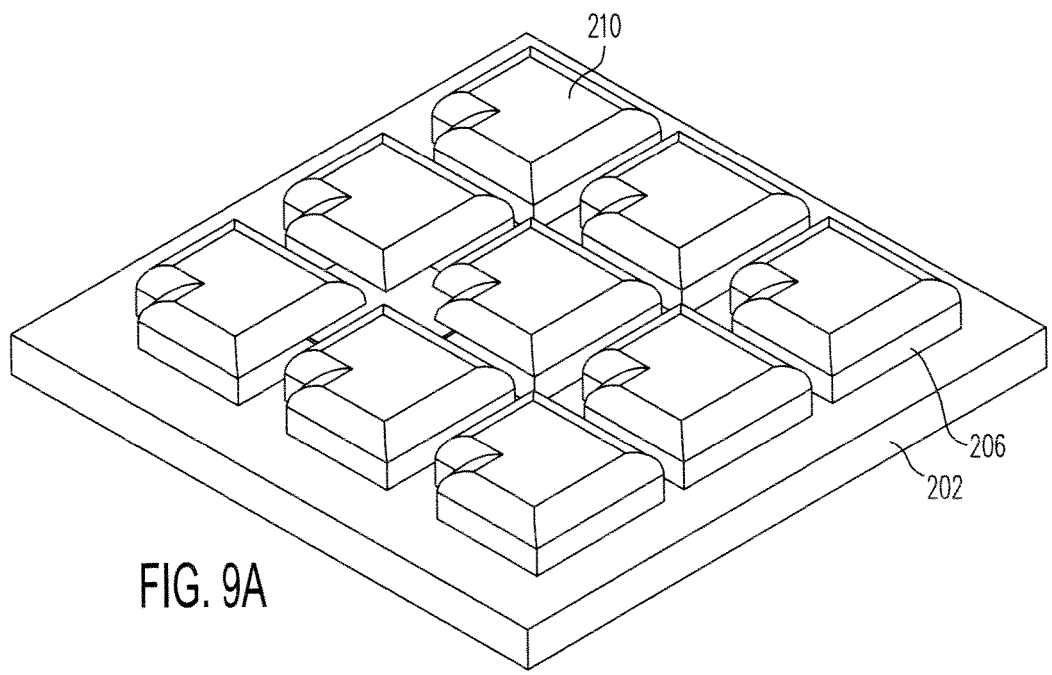
FIGS. 9A-9D illustrate, in cross-sectional and plan views, an inline repair of a first defect in the manufacturing method according to the present invention.
Figure 9B:
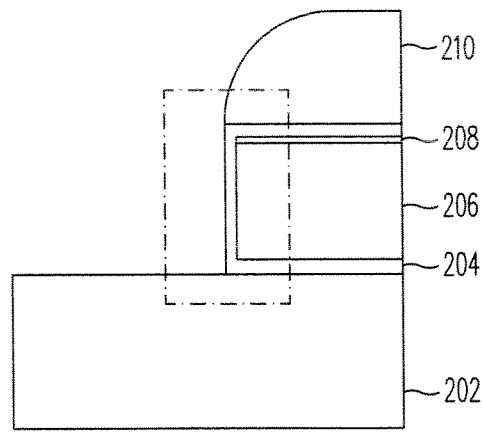
Figure 9C:
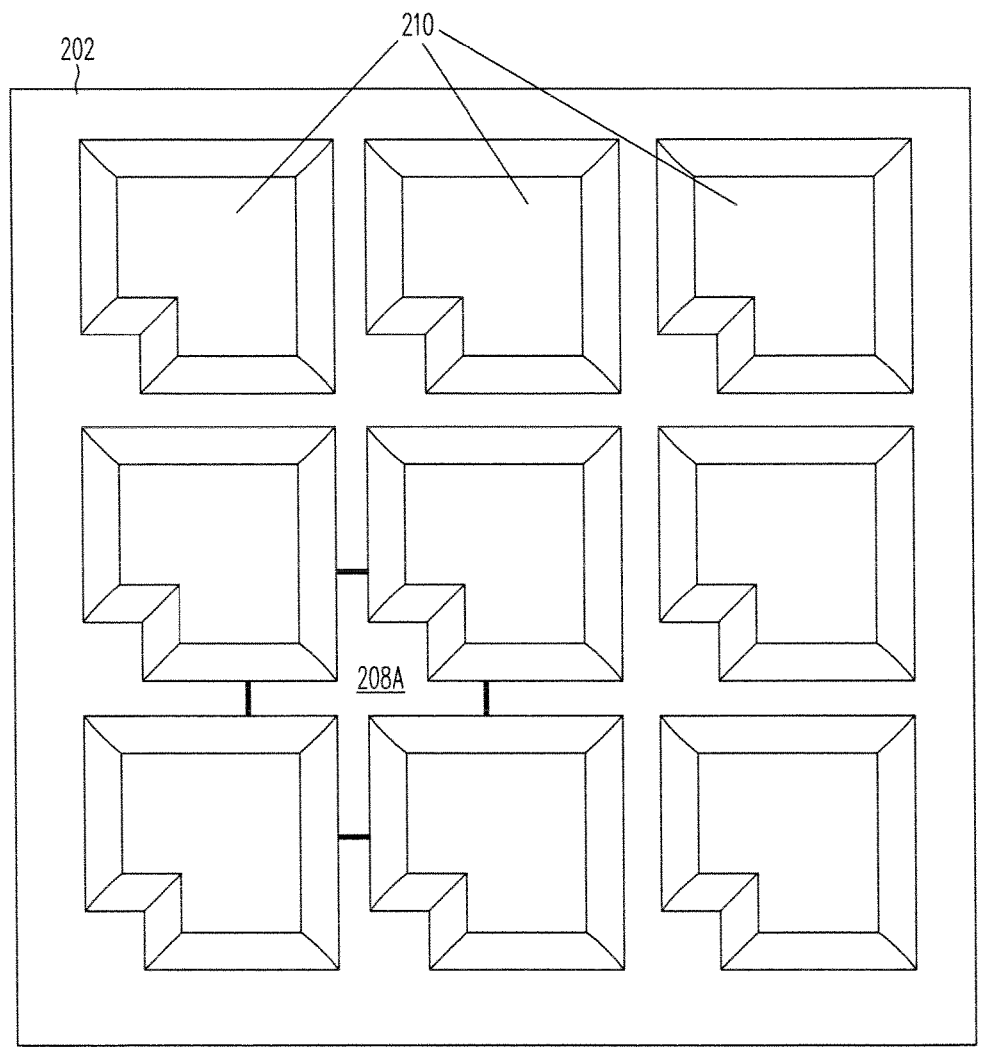
Figure 9D:
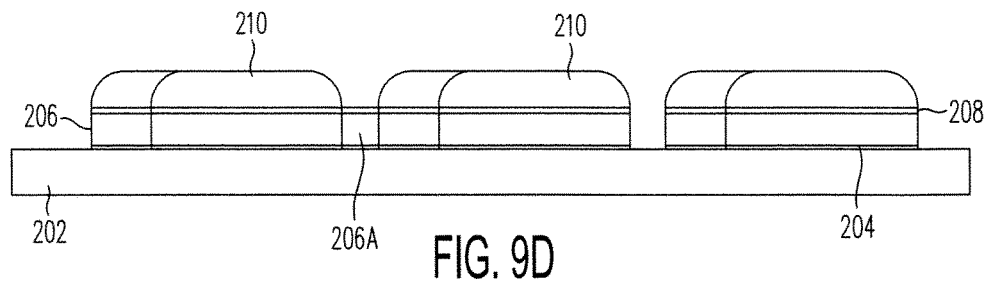

Referring to FIGS. 9A-9D, a new photoresist layer 210 is used that corresponds generally to previous photoresist layer 110. One key difference between the two photoresist layers is the size of the pixel patterns used. The first photoresist layer 110 comprises a plurality of first pixel patterns and the second photoresist layer 210 comprises a plurality of second pixel patterns, and wherein at least one of the second pixel patterns has an area greater than that of a corresponding first pixel pattern. The pixel pattern in photoresist layer 210 is slightly larger in both planar dimensions by a predetermined amount. As an example, the pixel pattern in photoresist layer 210 is expanded by 4 µm in each planar dimension. The amount of expansion is not fixed but rather determined by the exact process dimensions of the manufacturing method that is being used. Re-masking using photoresist layer 210 ensures that the sidewalls of previously etched layers 204, 206, and 208 in the plurality of defect-free pixels are protected.

Figure 10A:
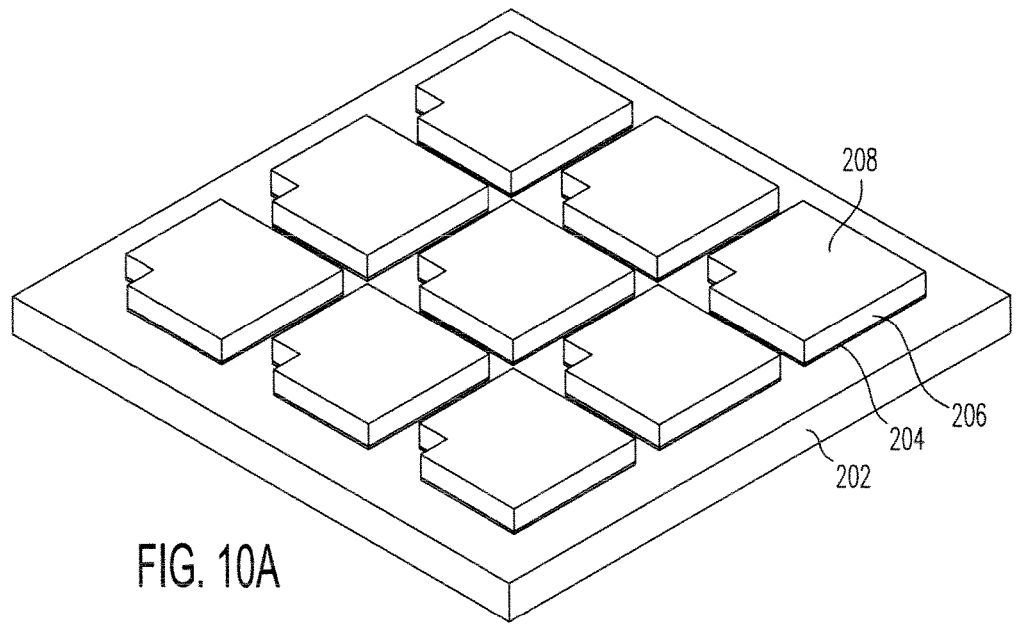
FIGS. 10A-10E illustrate, in cross-sectional and plan views, an inline repair of a first defect in the manufacturing method according to the present invention.
Figure 10E:
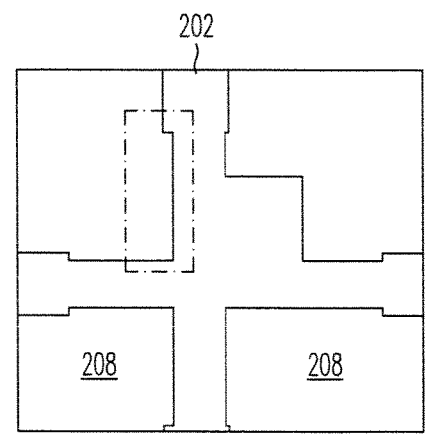
Figure 10B:
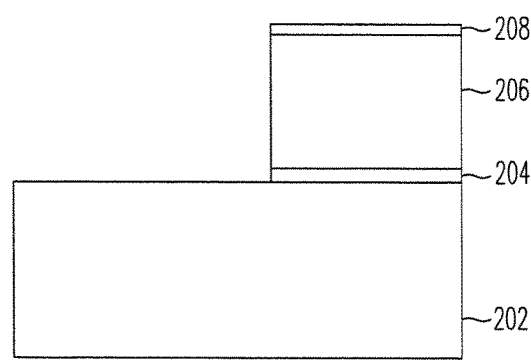
Figure 10C:
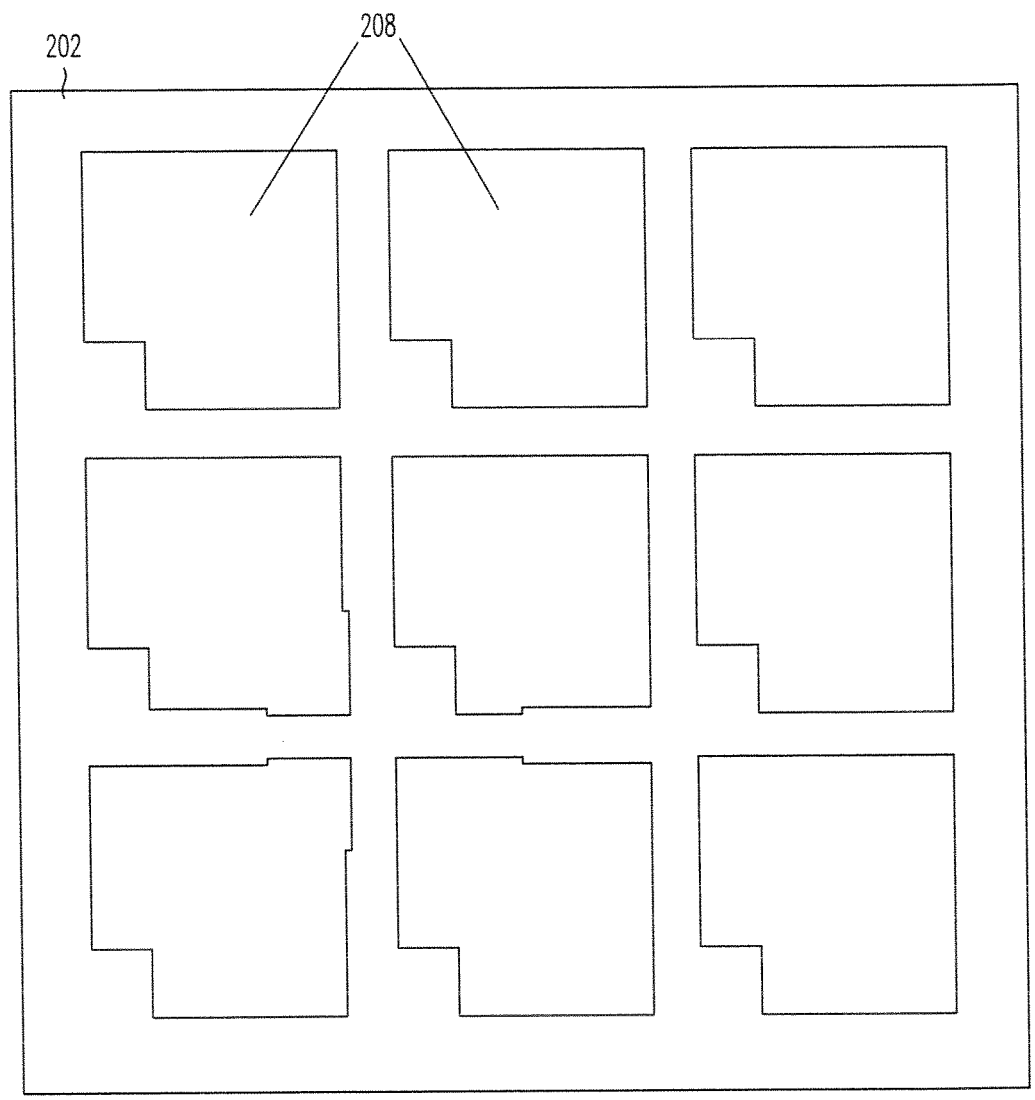
Figure 10D:
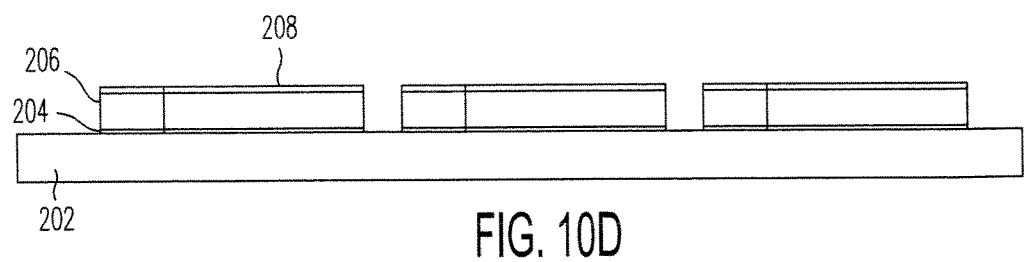

Referring to FIGS. 10A-10E, the re-etch using photoresist layer 210 has been accomplished in order to remove the unwanted bridging of layers 204, 206, and 208 between pixels. Photoresist layer 210 has also been stripped in FIGS. 10A-10E. FIGS. 10A-10E clearly show that all of the pixels in the image sensor device are now defect-free and the bridging materials have been removed. Also shown in FIGS. 10A-10E, however, are small artifacts that are related to the difference in the dimensions of the pixel patterns associated with photoresist layer 110 and the dimensions of the pixel patterns associated with photoresist layer 210.

Figure 11A:
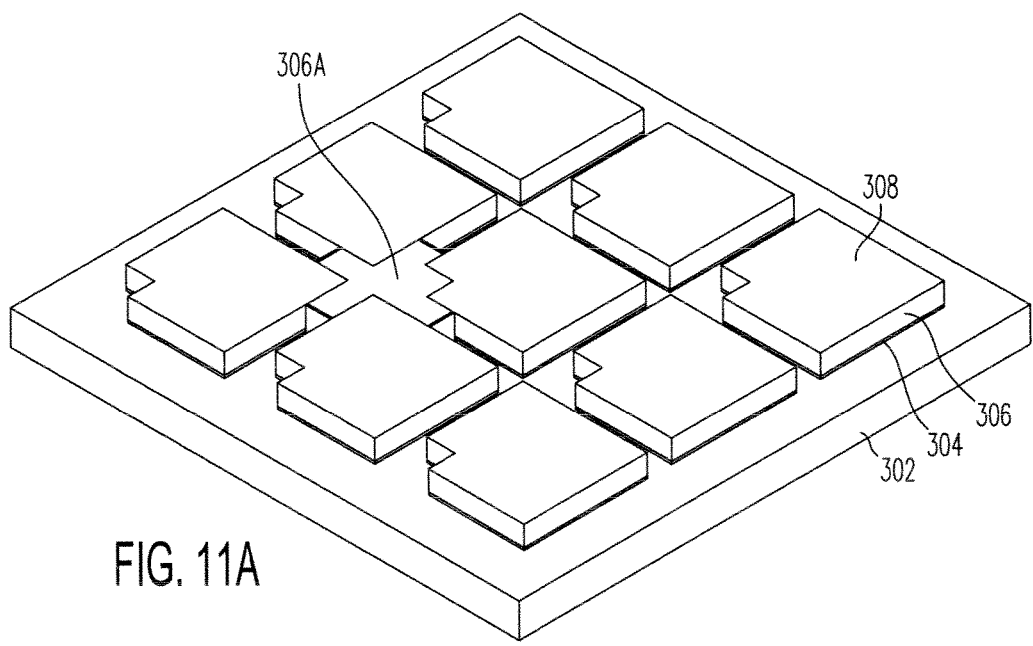
FIGS. 11A-11D illustrate, in cross-sectional and plan views, an inline repair of a second defect in the manufacturing method according to the present invention.
Figure 11B:
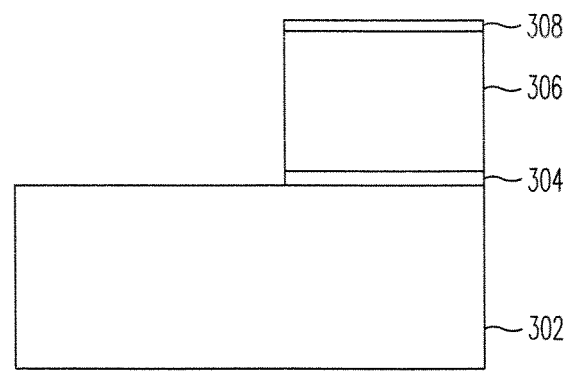
Figure 11C:
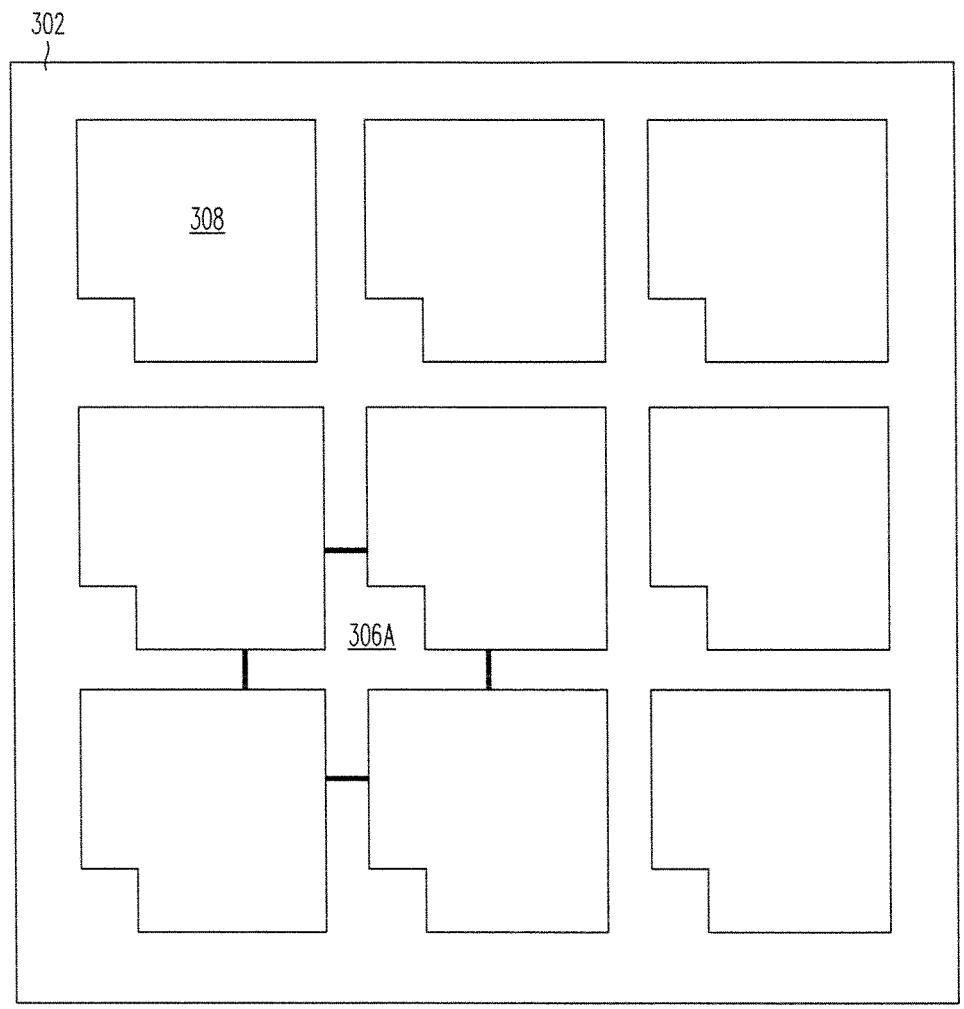
Figure 11D:
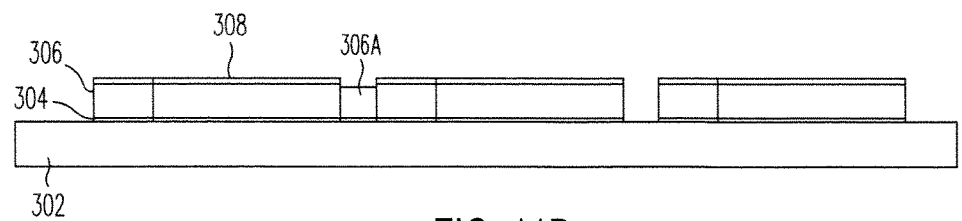

Referring to FIGS. 11A-11D, the substrate 302, bottom electrode layer 304, sensor material layer 306, and a top electrode layer 308 are shown. Note that in FIGS. 11A-11D a defect 306A has been detected. In the example of FIGS. 11A-11D, the defect implicates two layers 304 and 306, and layer 308 is not implicated. If left in this state, the image sensor would have to be scrapped or repaired. In the example of FIGS. 11A-11D, the defect 306A couples a defective pixel to three neighboring pixels through layers 304 and 306.

Figure 12A:
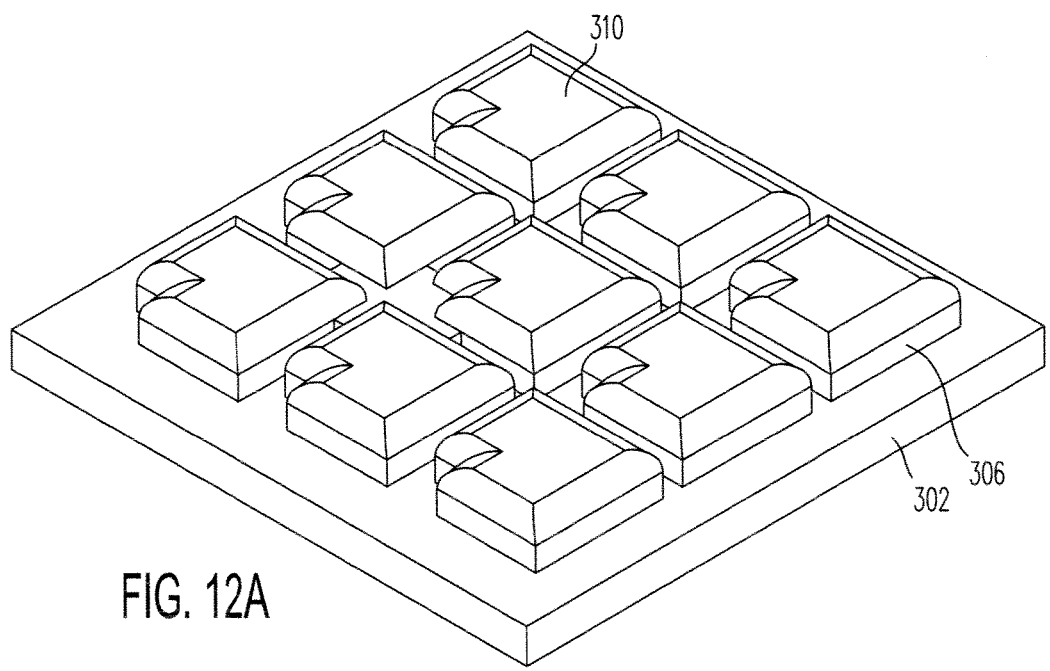
FIGS. 12A-12D illustrate, in cross-sectional and plan views, an inline repair of a second defect in the manufacturing method according to the present invention.
Figure 12B:
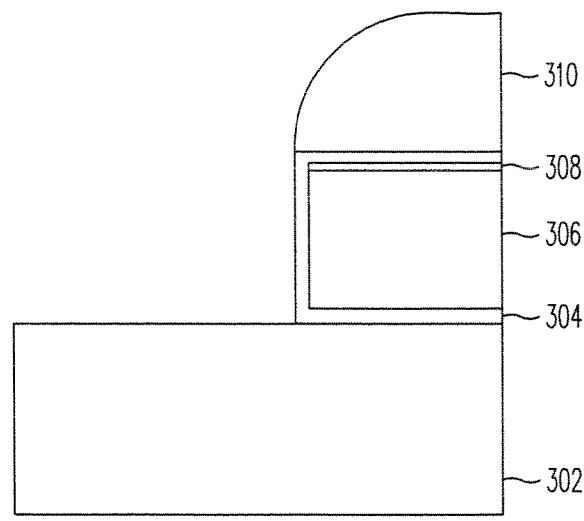
Figure 12C:
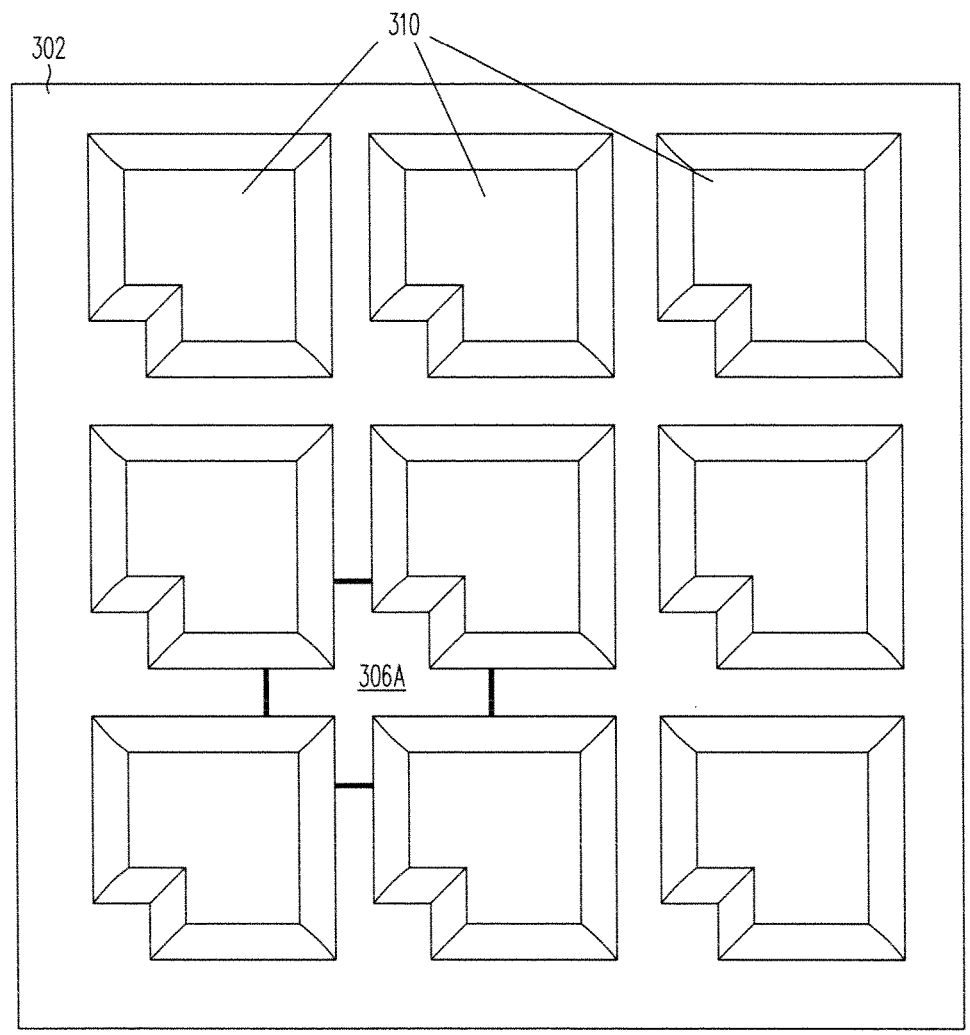
Figure 12D:
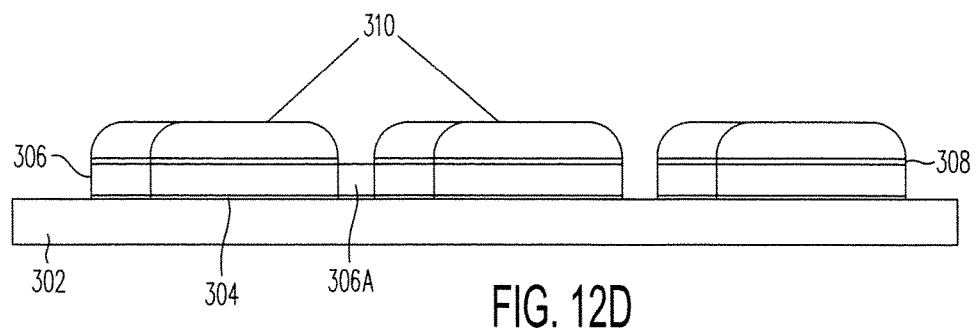

Referring to FIGS. 12A-12D, a new photoresist layer 310 is used that corresponds generally to previous photoresist layer 110. One key difference between the two photoresist layers is the size of the pixel patterns used. The first photoresist layer 110 comprises a plurality of first pixel patterns and the second photoresist layer 310 comprises a plurality of second pixel patterns, and wherein at least one of the second pixel patterns has an area greater than that of a corresponding first pixel pattern. The pixel pattern in photoresist layer 310 is slightly larger in both planar dimensions by a predetermined amount. As an example, the pixel pattern in photoresist layer 310 is expanded by 4 µm in each planar dimension. The amount of expansion is not fixed but rather determined by the exact process dimensions of the manufacturing method that is being used. Re-masking using photoresist layer 310 ensures that the sidewalls of previously etched layers 304, 306, and 308 in the plurality of defect-free pixels are protected.

Figure 13A:
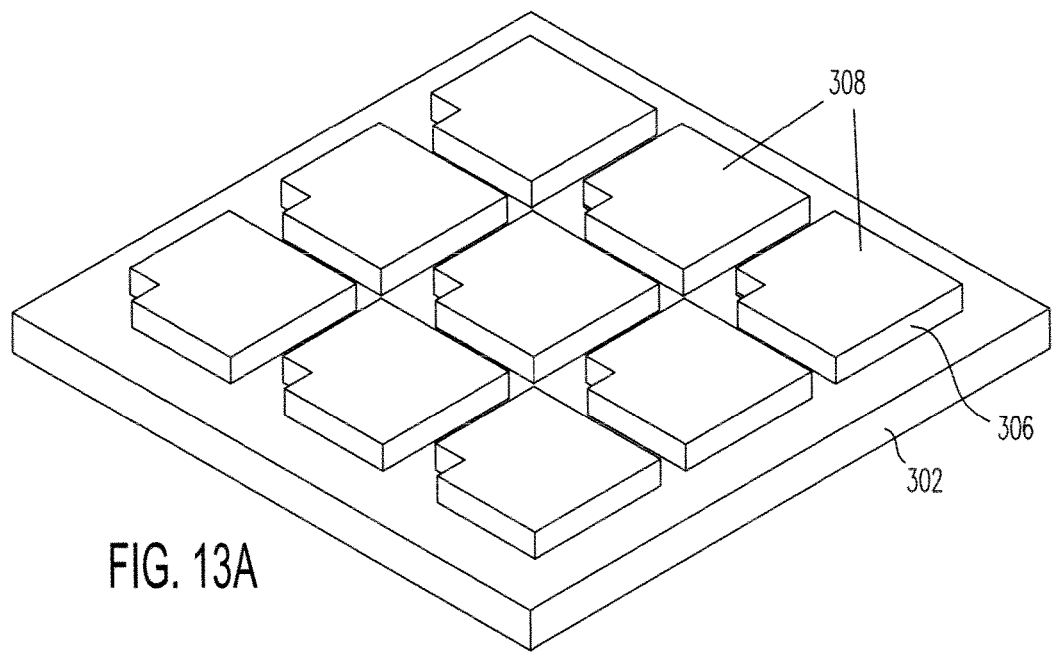
FIGS. 13A-13D illustrate, in cross-sectional and plan views, an inline repair of a second defect in the manufacturing method according to the present invention.
Figure 13B:
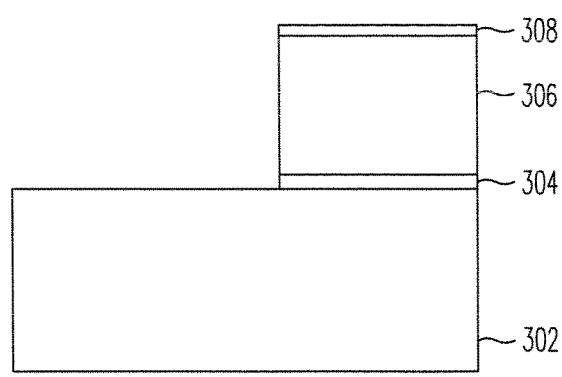
Figure 13C:
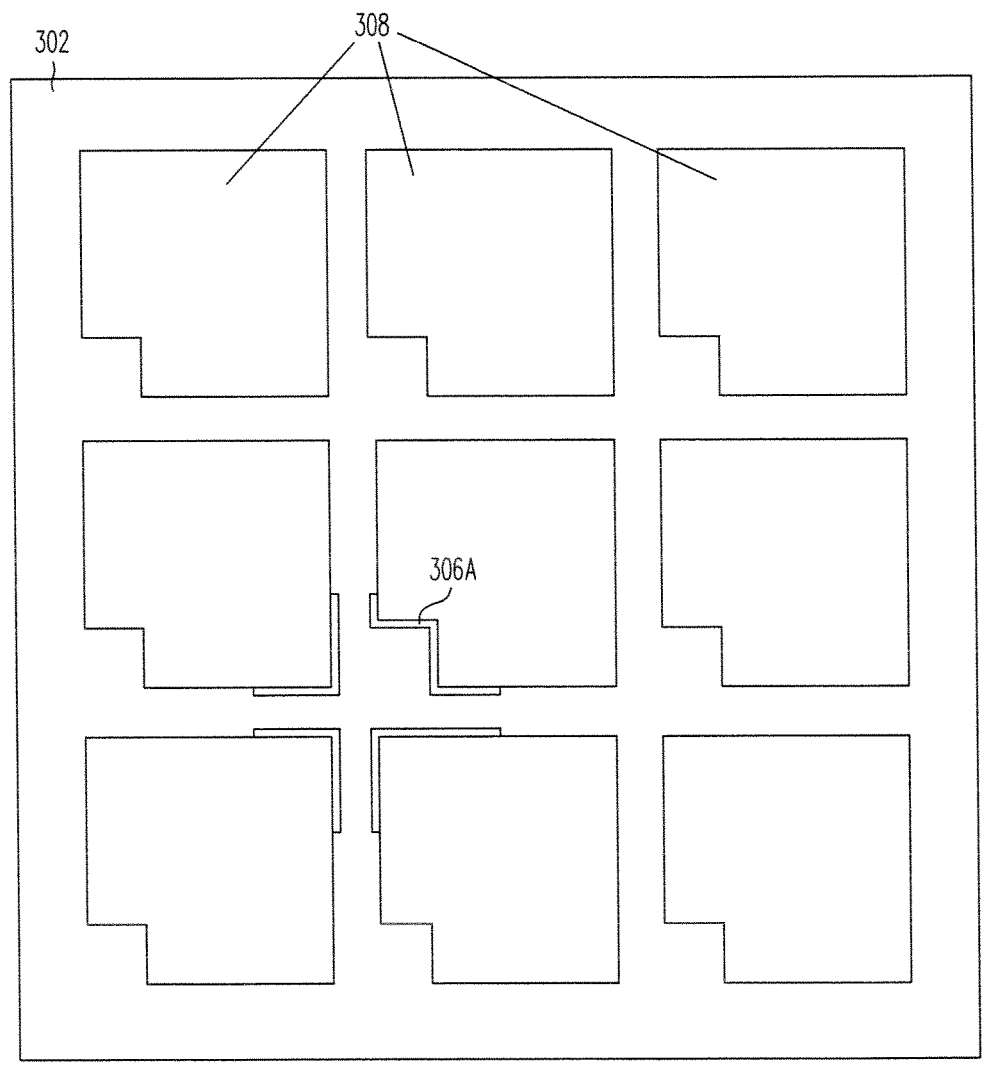
Figure 13D:
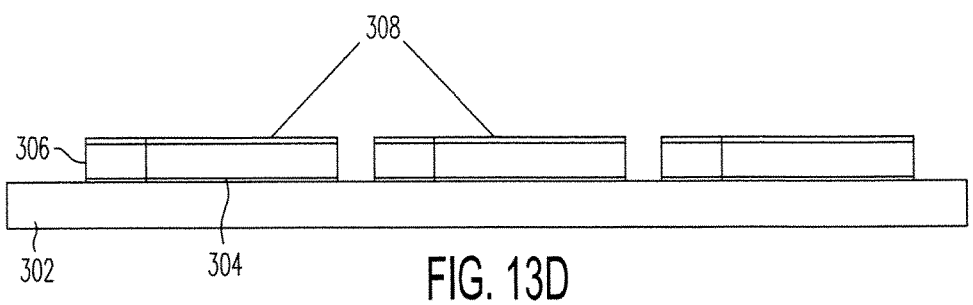

Referring to FIGS. 13A-13D, the re-etch using photoresist layer 310 has been accomplished in order to remove the unwanted bridging of layers 304 and 306 between pixels. Photoresist layer 310 has also been stripped in FIGS. 13A-13D. FIGS. 13A-13D clearly show that all of the pixels in the image sensor device are now defect-free and the bridging materials have been removed. Also shown in FIGS. 13A-13D, however, are small artifacts 306A that are related to the difference in the dimensions of the pixel patterns associated with photoresist layer 110 and the dimensions of the pixel patterns associated with photoresist layer 310.

Figure 14A:
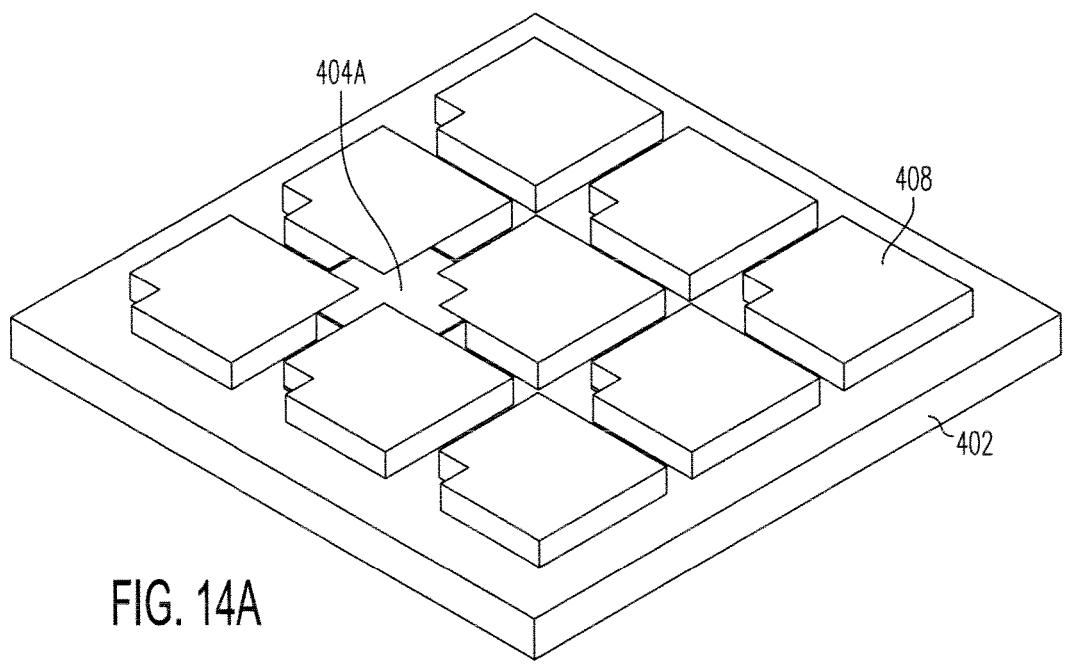
FIGS. 14A-14D illustrate, in cross-sectional and plan views, an inline repair of a third defect in the manufacturing method according to the present invention.
Figure 14B:
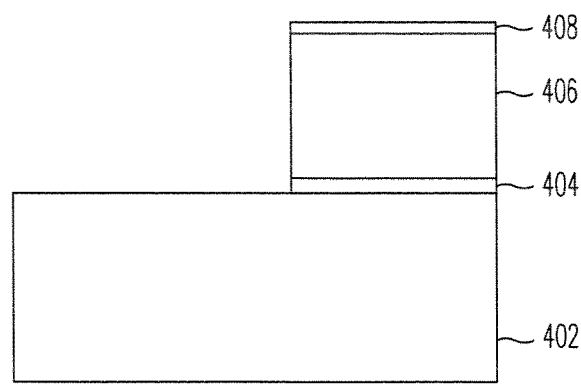
Figure 14C:
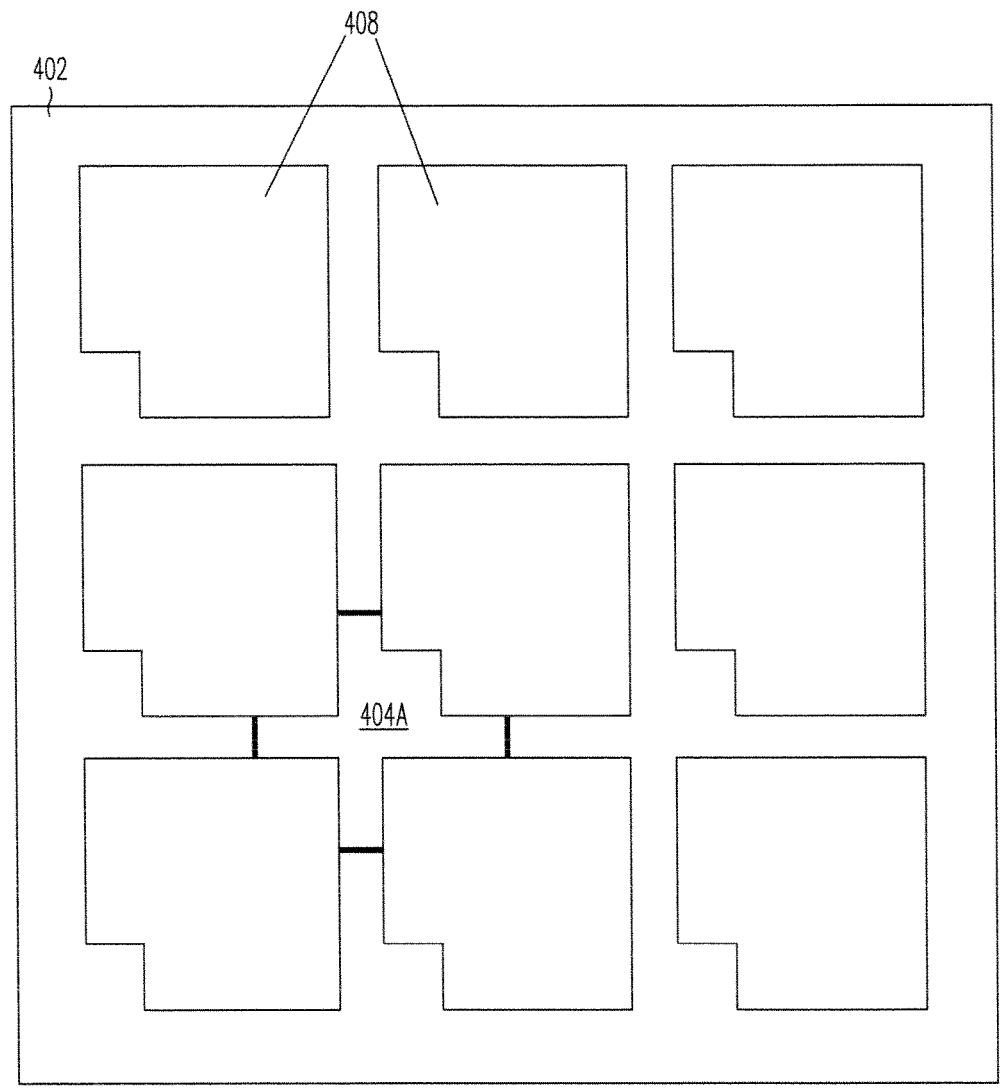
Figure 14D:
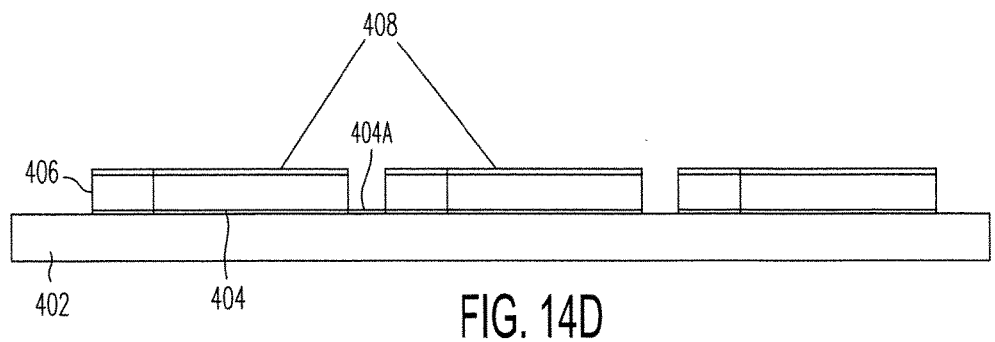

Referring to FIGS. 14A-14D, the substrate 402, bottom electrode layer 404, sensor material layer 406, and a top electrode layer 408 are shown. Note that in FIGS. 14A-14D a defect 404A has been detected. In the example of FIGS. 14A-14D, the defect implicates only layer 404, and layer 406 and layer 408 are not implicated. If left in this state, the image sensor would have to be scrapped or repaired. In the example of FIGS. 14A-14D, the defect 404A couples a defective pixel to three neighboring pixels through layer 404.

Figure 15A:
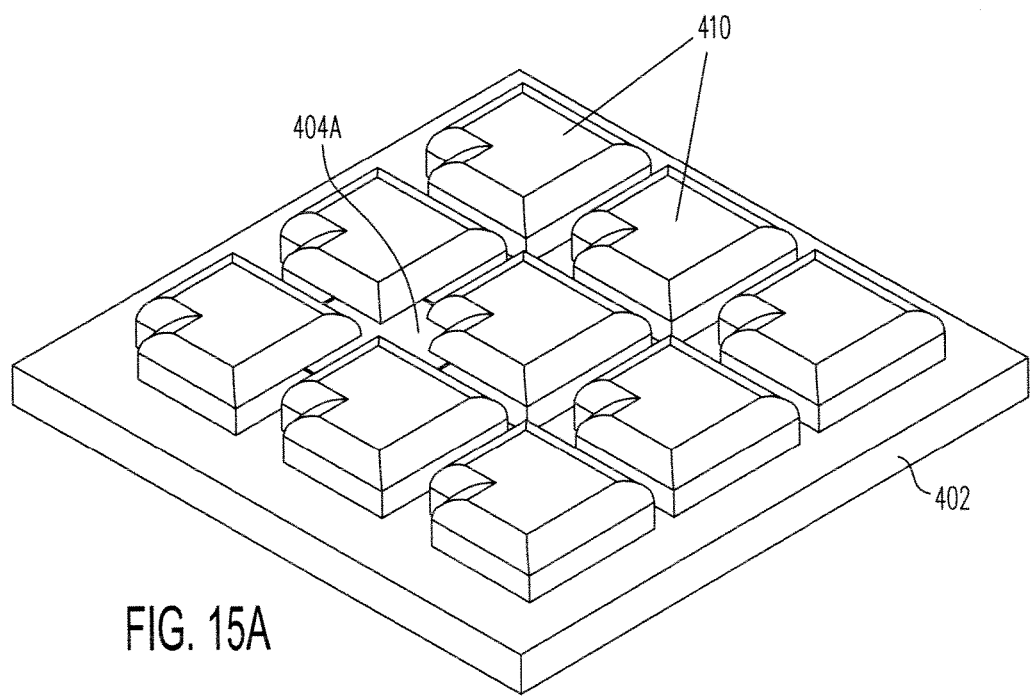
FIGS. 15A-15D illustrate, in cross-sectional and plan views, an inline repair of a third defect in the manufacturing method according to the present invention.
Figure 15B:
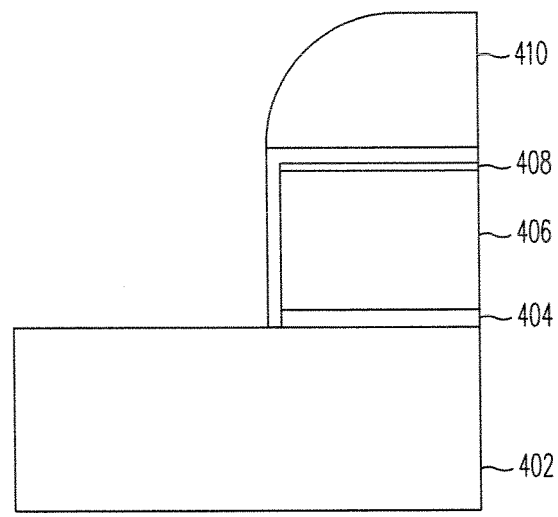
Figure 15C:
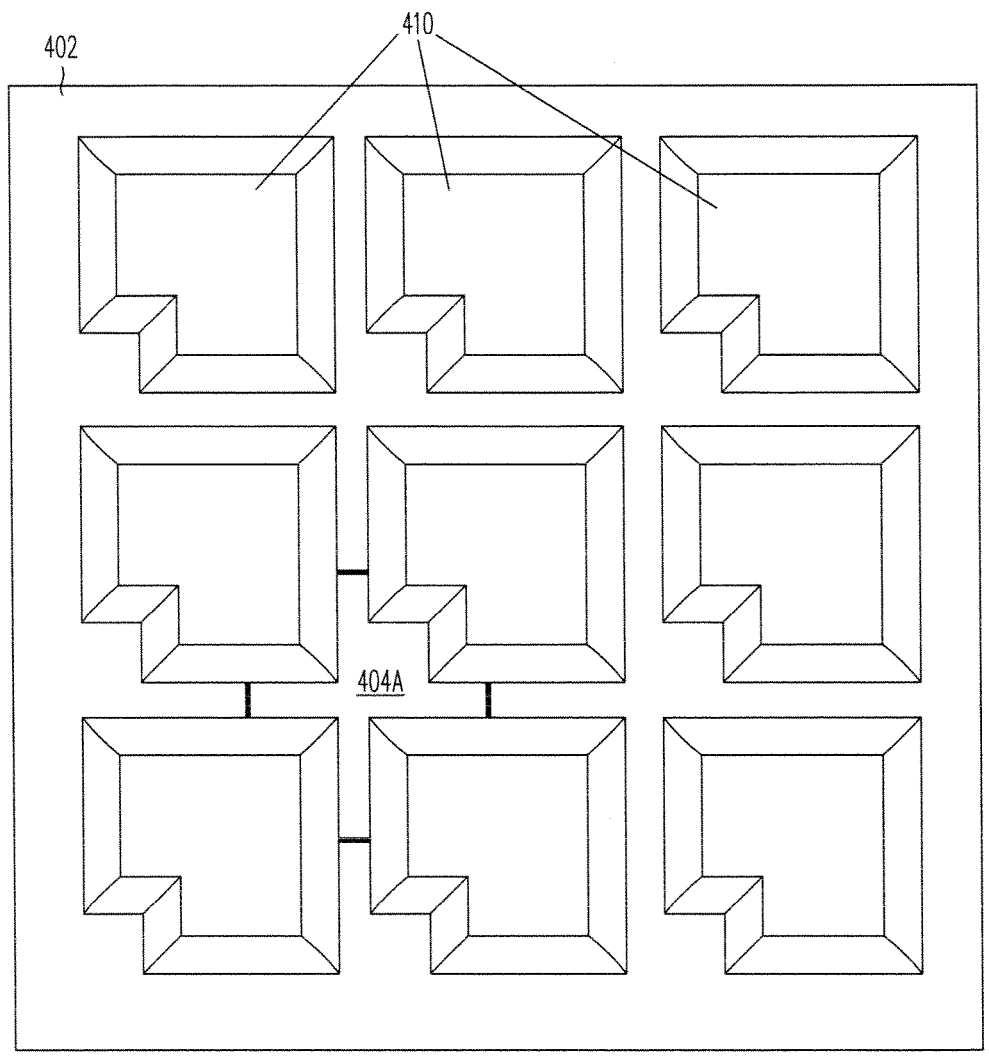
Figure 15D:
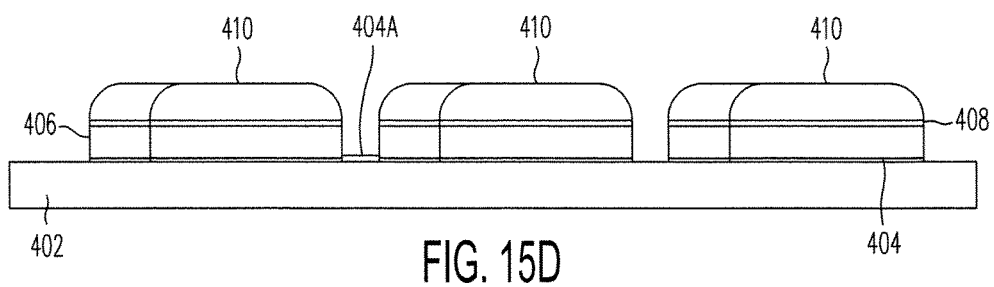

Referring to FIGS. 15A-15D, a new photoresist layer 410 is used that corresponds generally to previous photoresist layer 110. One key difference between the two photoresist layers is the size of the pixel patterns used. The first photoresist layer 110 comprises a plurality of first pixel patterns and the second photoresist layer 410 comprises a plurality of second pixel patterns, and wherein at least one of the second pixel patterns has an area greater than that of a corresponding first pixel pattern. The pixel pattern in photoresist layer 410 is slightly larger in both planar dimensions by a predetermined amount. As an example, the pixel pattern in photoresist layer 410 is expanded by 4 µm in each planar dimension. The amount of expansion is not fixed but rather determined by the exact process dimensions of the manufacturing method that is being used. Re-masking using photoresist layer 410 ensures that the sidewalls of previously etched layers 404, 406, and 408 in the plurality of defect-free pixels are protected.

Figure 16A:
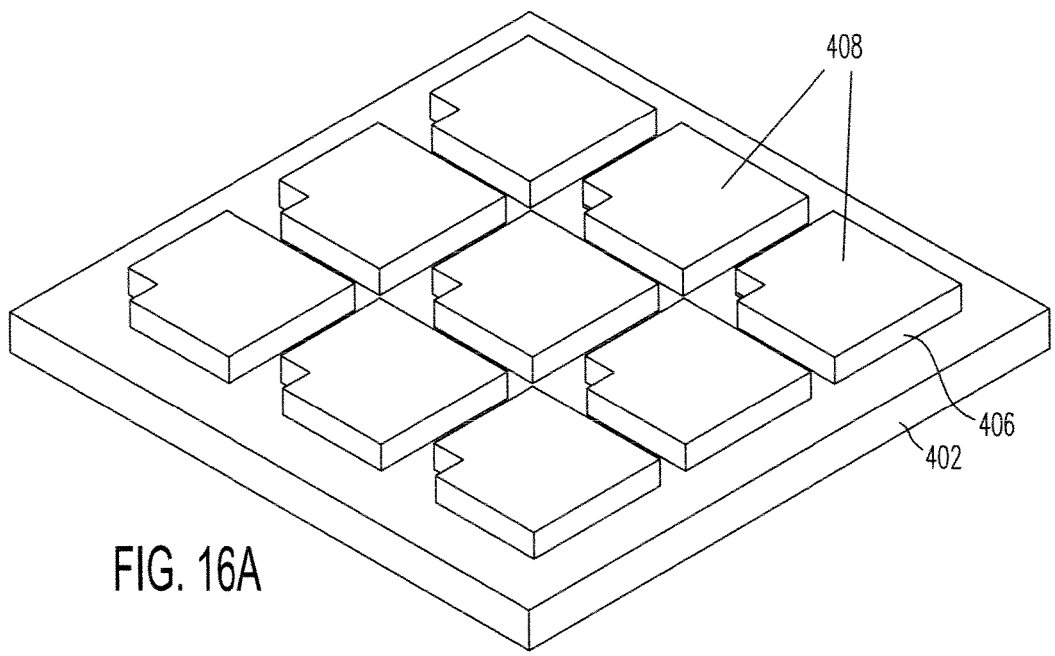
FIGS. 16A-16D illustrate, in cross-sectional and plan views, an inline repair of a third defect in the manufacturing method according to the present invention.
Figure 16B:
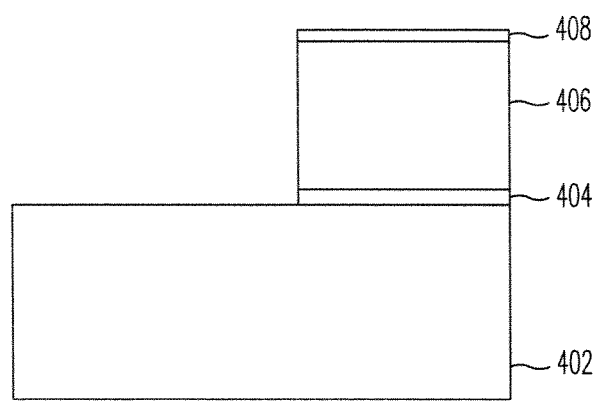
Figure 16C:
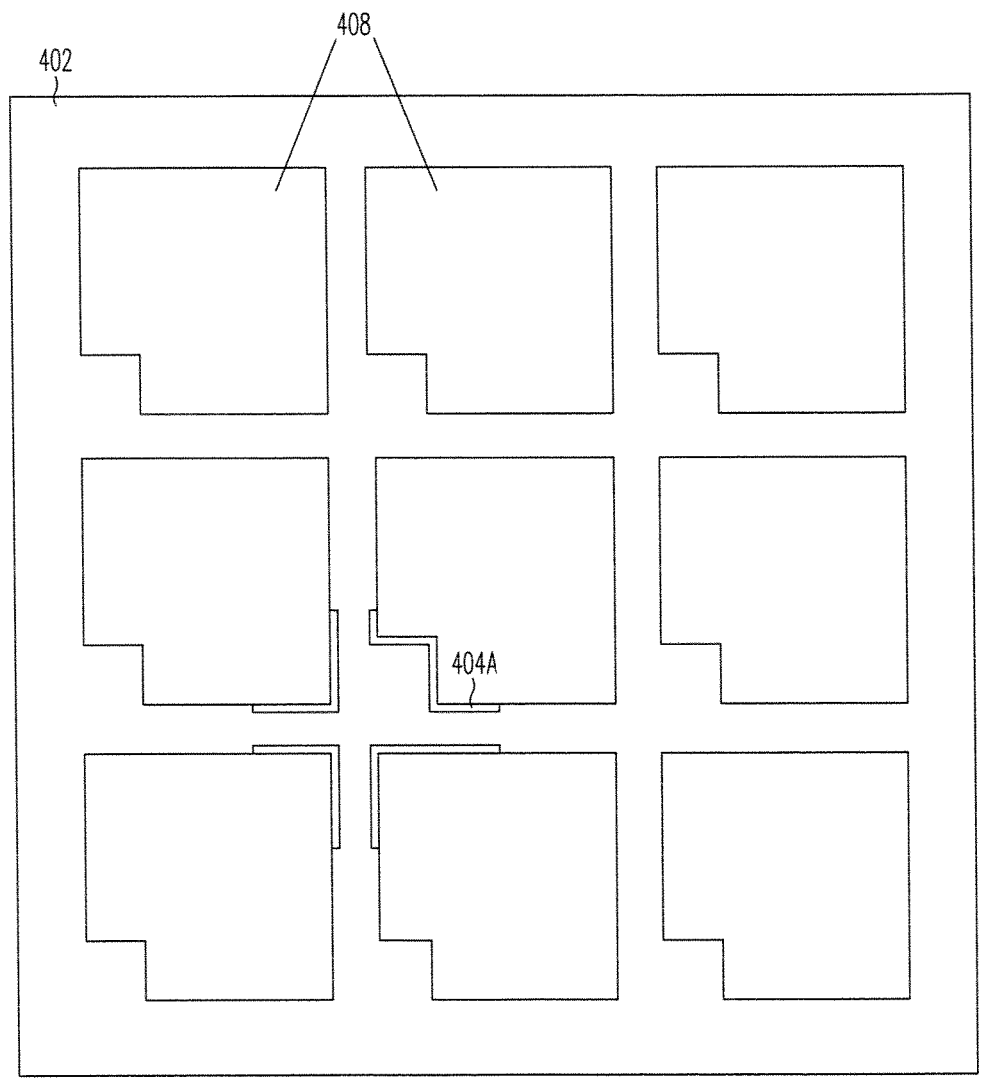
Figure 16D:
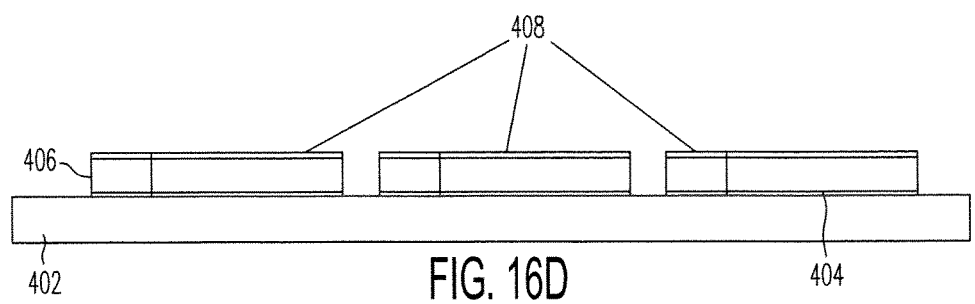

Referring to FIGS. 16A-16D, the re-etch using photoresist layer 410 has been accomplished in order to remove the unwanted bridging of layer 404 between pixels. Photoresist layer 410 has also been stripped in FIGS. 16A-16D. FIGS. 16A-16D clearly show that all of the pixels in the image sensor device are now defect-free and the bridging materials have been removed. Also shown in FIGS. 16A-16D, however, are small artifacts 404A that are related to the difference in the dimensions of the pixel patterns associated with photoresist layer 110 and the dimensions of the pixel patterns associated with photoresist layer 410.

Figure 17A:
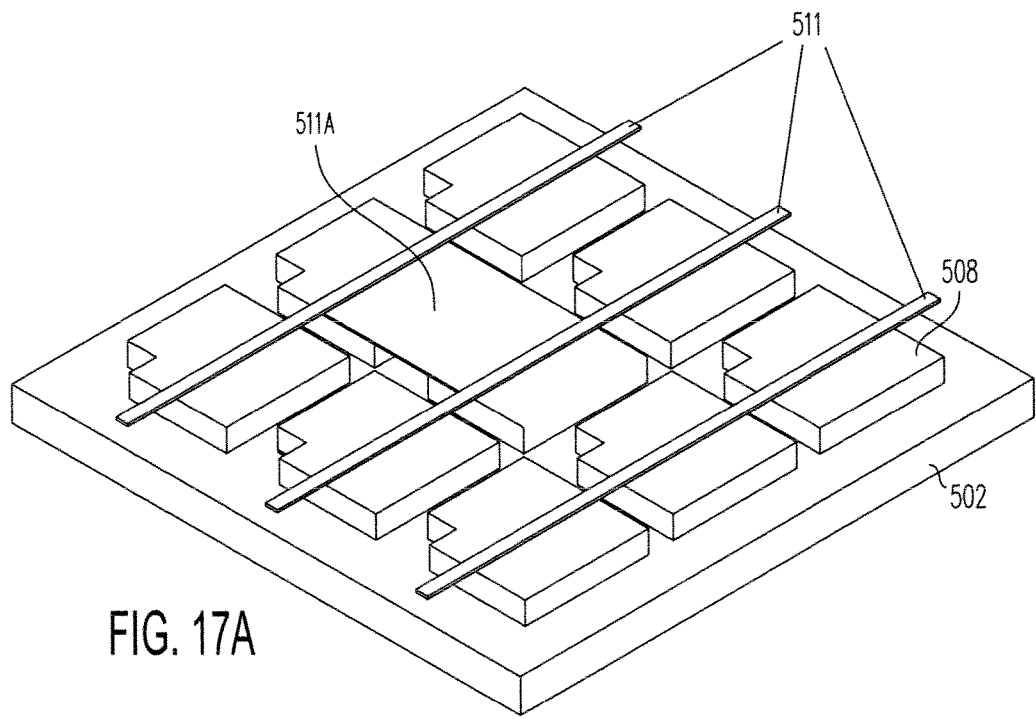
FIGS. 17A-17D illustrate, in cross-sectional and plan views, an inline repair of a fourth defect in the manufacturing method according to the present invention.
Figure 17B:
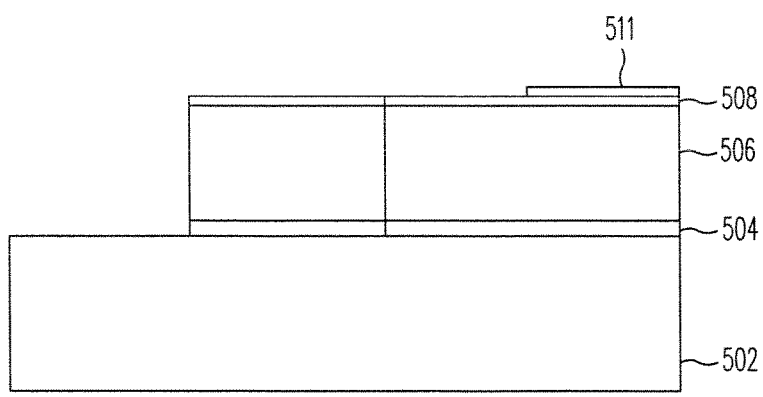
Figure 17C:
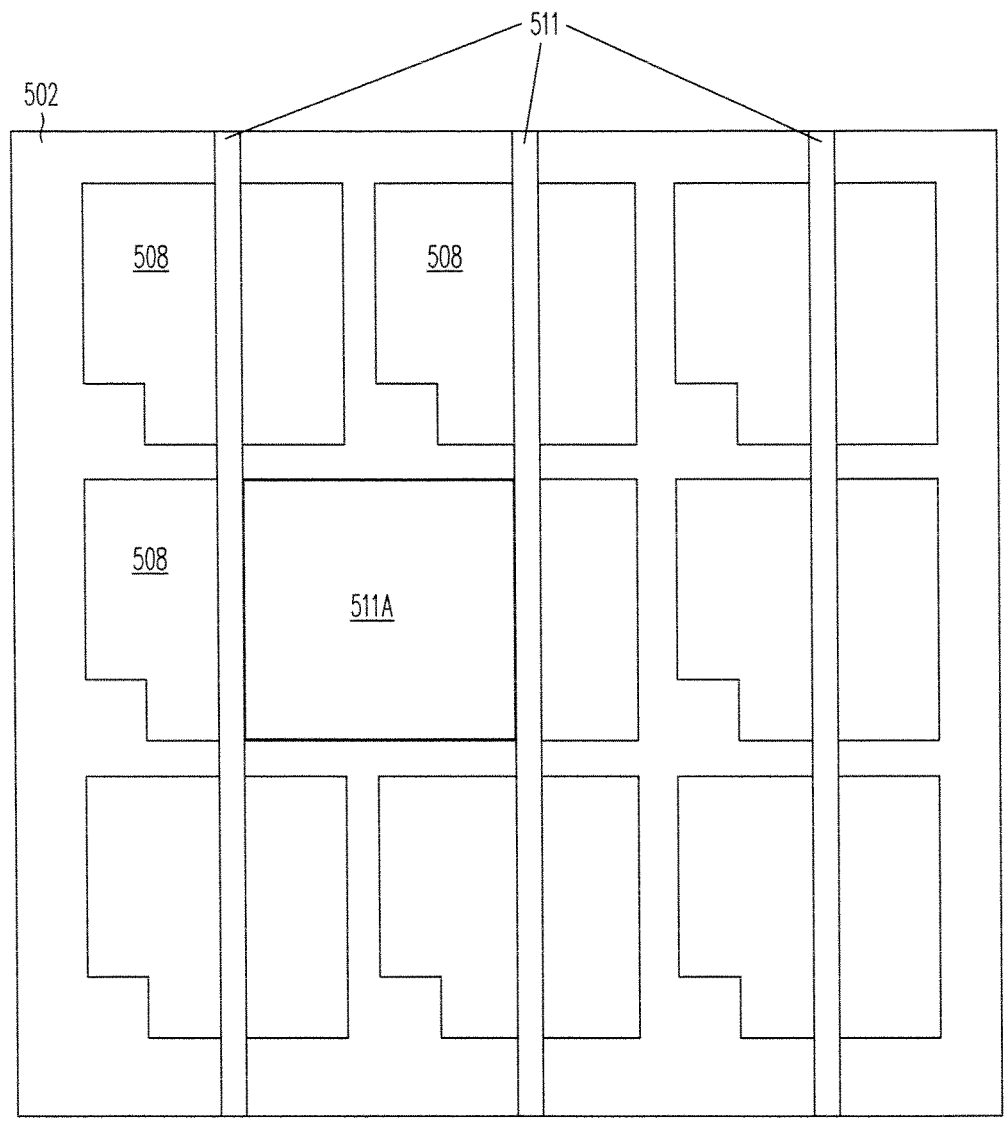
Figure 17D:
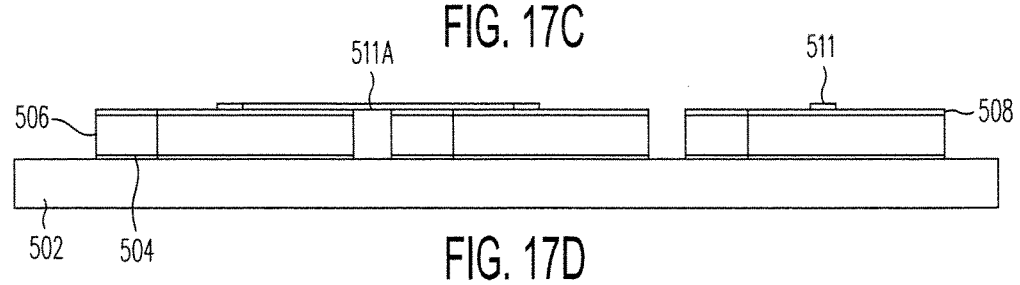

Referring to FIGS. 17A-17D, the substrate 502, bottom electrode layer 504, sensor material layer 506, and a top electrode layer 508 are shown. Also shown is a plurality of data lines 511. Note that in FIGS. 17A-17D a defect 511A has been detected. In the example of FIGS. 17A-17D, the defect implicates only layer 511 and the other layers are not implicated. Defect 511A is depicted as a short circuit between two parallel data lines 511. If left in this state, the image sensor would have to be scrapped or repaired. In the example of FIGS. 17A-17D, the defect 511A couples two neighboring pixels together by shorting out the data lines 511 as previously mentioned.

Figure 18A:
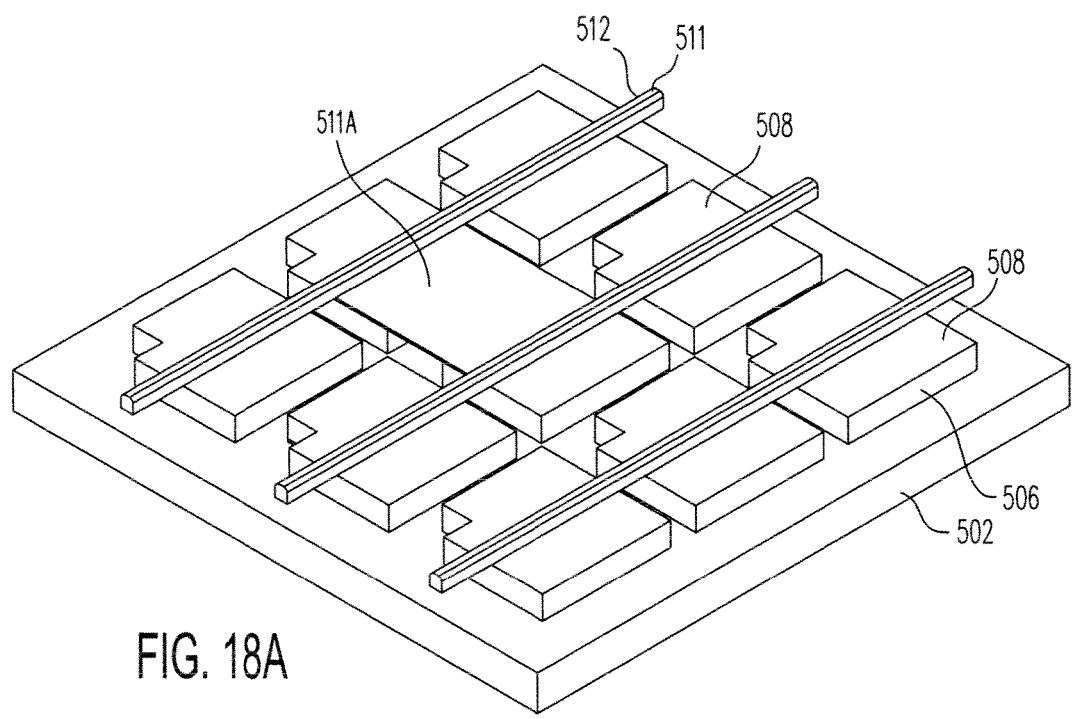
FIGS. 18A-18D illustrate, in cross-sectional and plan views, an inline repair of a fourth defect in the manufacturing method according to the present invention.
Figure 18B:
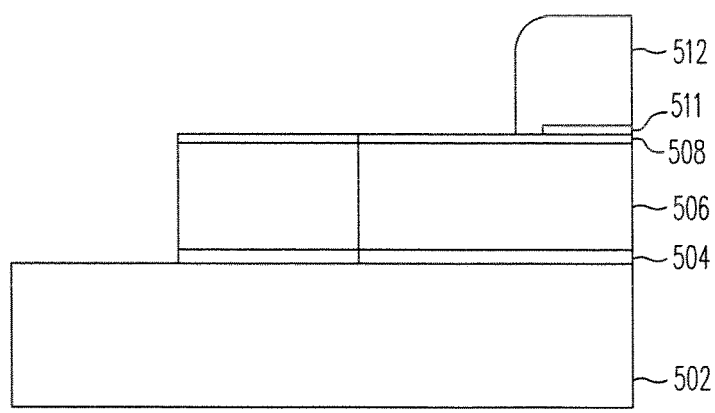
Figure 18C:
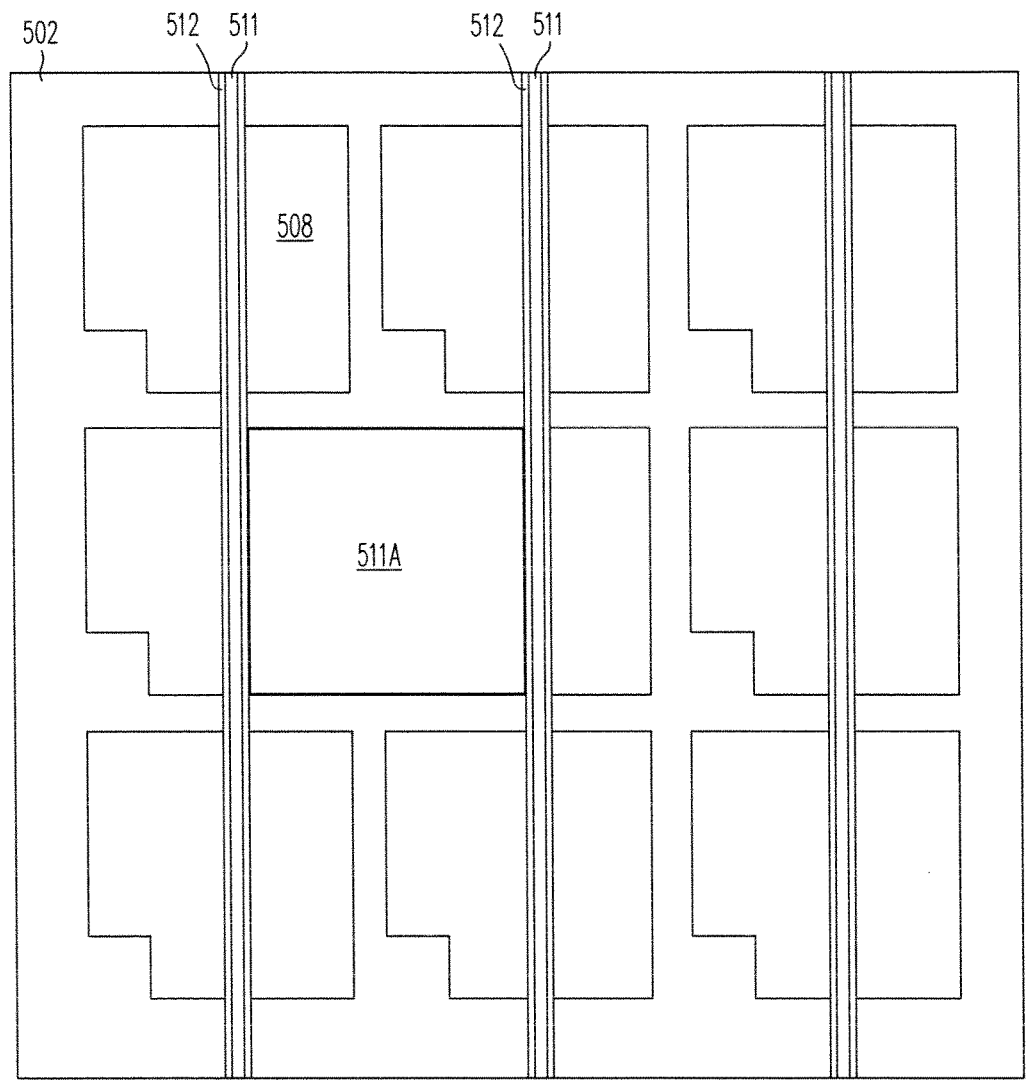
Figure 18D:
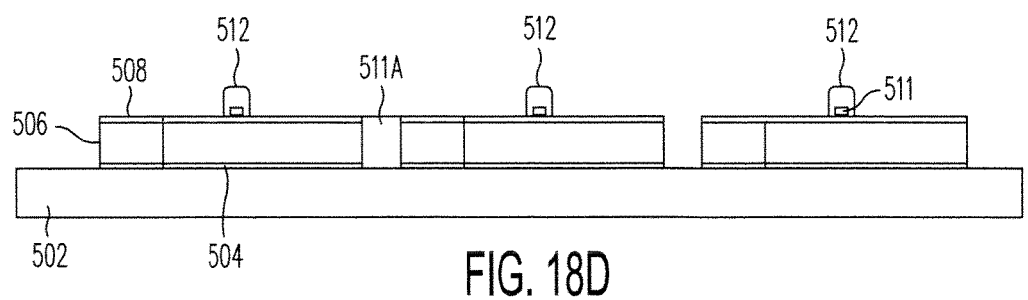

Referring to FIGS. 18A-18D, a new photoresist layer 512 is used that corresponds generally to previous photoresist layer 112. One key difference between the two photoresist layers is the size of the pixel patterns used. The first photoresist layer 112 comprises a plurality of first data line patterns and the second photoresist layer 512 comprises a plurality of second data line patterns, and wherein at least one of the second data line patterns has an area greater than that of a corresponding first data line pattern. The pixel pattern in photoresist layer 512 is slightly larger by a predetermined amount. As an example, the data line pattern in photoresist layer 512 is expanded by 4 μm on each side. The amount of expansion is not fixed but rather determined by the exact process dimensions of the manufacturing method that is being used. Re-masking using photoresist layer 512 ensures that the sidewalls of previously etched data lines 511 are protected.

Figure 19A:
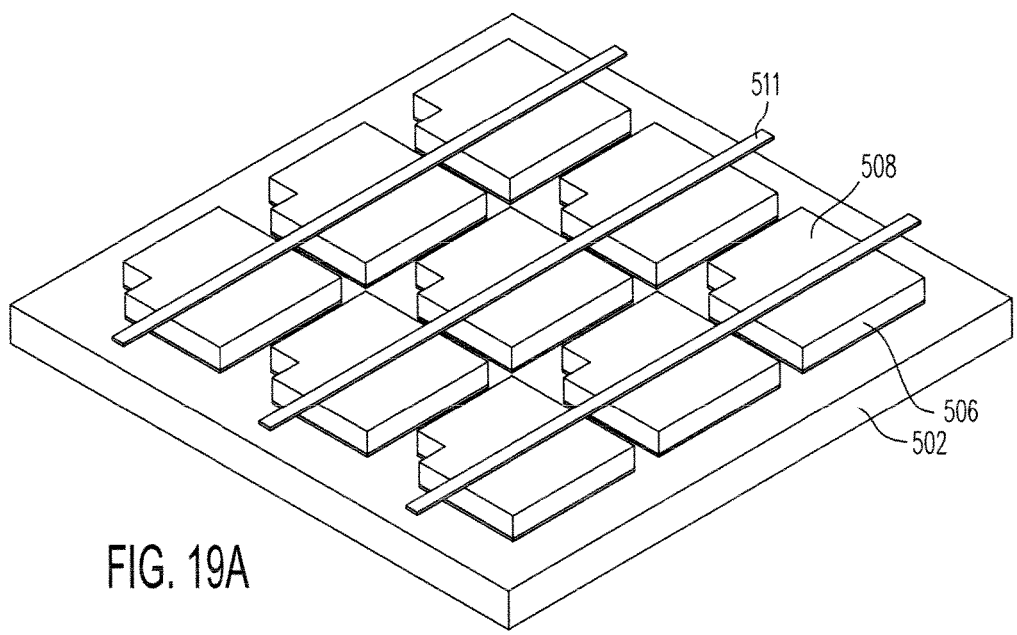
FIGS. 19A-19D illustrate, in cross-sectional and plan views, an inline repair of a fourth defect in the manufacturing method according to the present invention.
Figure 19B:
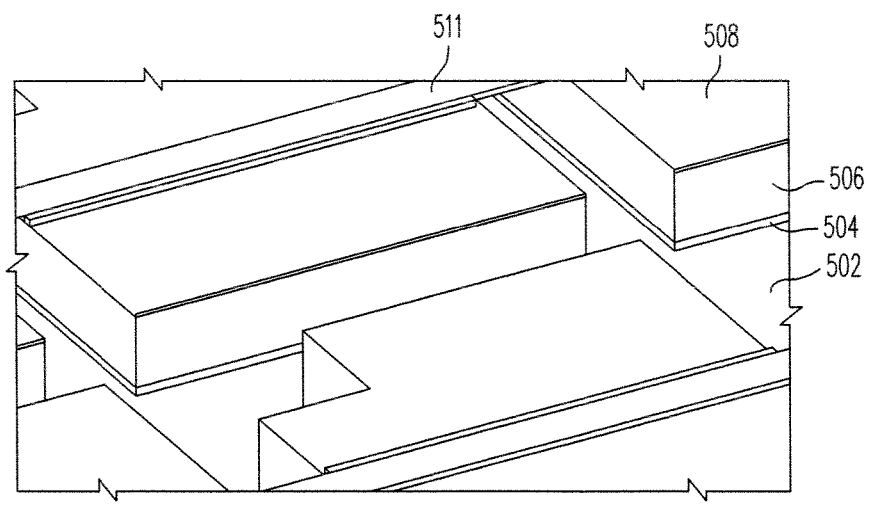
Figure 19C:
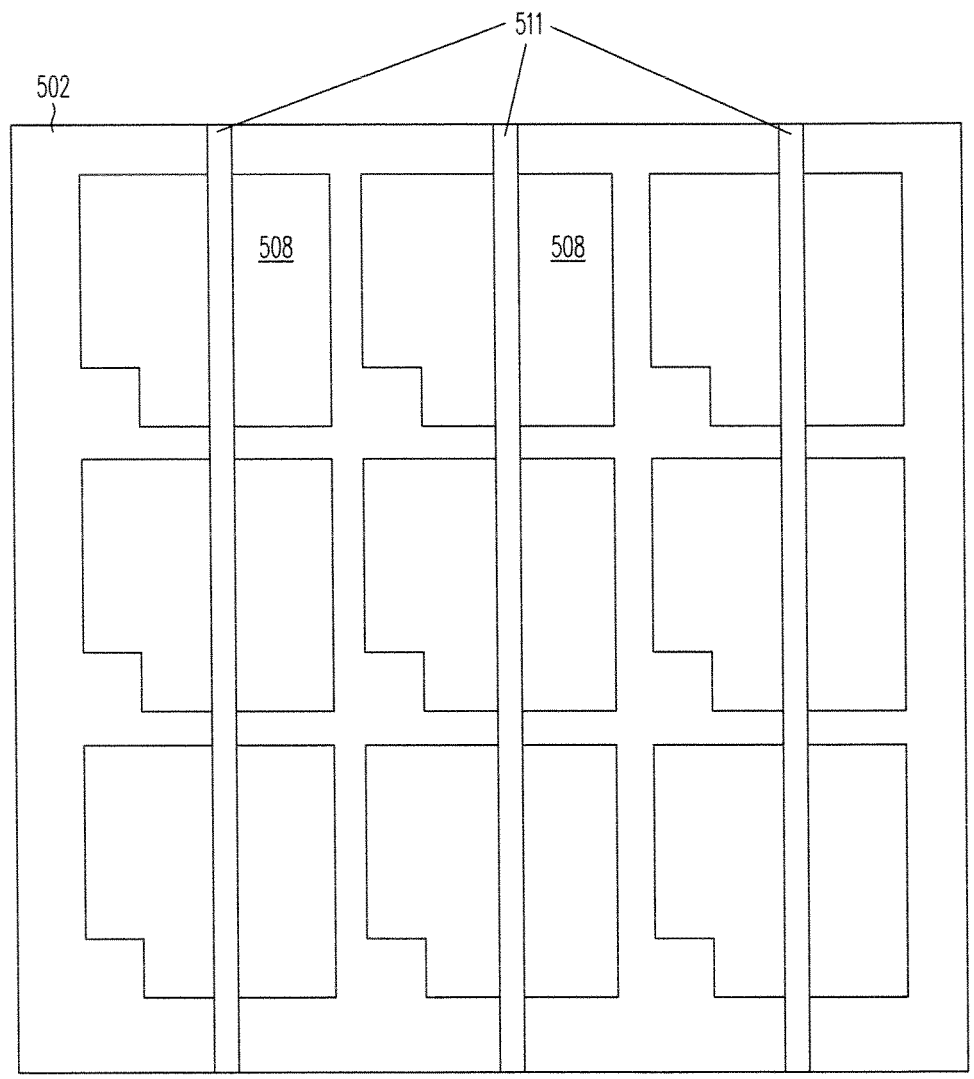
Figure 19D:
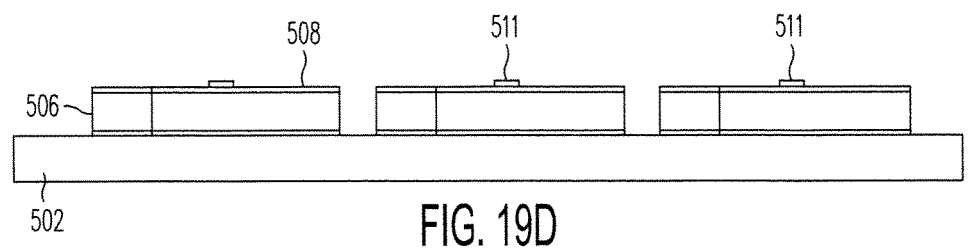

Referring to FIGS. 19A-19D, the re-etch using photoresist layer 512 has been accomplished in order to remove the unwanted bridging of layer 511 between data lines. Photoresist layer 512 has also been stripped in FIGS. 19A-19D. FIGS. 19A-19D clearly show that all of the pixels in the image sensor device are now defect-free and the bridging materials have been removed. Not clearly shown in FIGS. 19A-19D, are small artifacts that are related to the difference in the dimensions of the data line patterns associated with photoresist layer 112 and the dimensions of the data line patterns associated with photoresist layer 512.

It will be understood by those skilled in the art that the manufacturing method with inline repair according to the present invention can be practiced with only one or more of the defects associated with the pixel manufacture, with defects associated with the data lines, or defects associated with both of the pixels and the data lines.

It will be understood by those skilled in the art that while a cross-section and corresponding plan view drawings of a manufacturing method for an image sensor array have been shown, the various layers depicted are not the only layers that can be used and other such layers can be substituted or added to as is known in the art.

It will be understood by those skilled in the art that although various materials and thicknesses have been recited, other substitute materials and other thicknesses can be used to accommodate a specific manufacturing method.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A method of manufacturing a sensor array comprising:
providing a glass substrate;
forming a bottom electrode layer over the glass substrate;
forming a sensor material layer over the bottom electrode layer;
forming a top electrode layer over the sensor material layer;
patterning the top electrode layer, the sensor material layer, and the bottom electrode layer using a first photoresist layer to form a plurality of pixels;
detecting a defect in the plurality of pixels; and
patterning the plurality of pixels using a second photoresist layer.

2. The method of claim 1 wherein the first photoresist layer comprises a plurality of first pixel patterns and the second photoresist layer comprises a plurality of second pixel patterns, and wherein at least one of the second pixel patterns has an area greater than that of a corresponding first pixel pattern.

3. The method of claim 1 wherein the defect in the plurality of pixels comprises an artifact in the bottom electrode layer connecting two pixels.

4. The method of claim 1 wherein the defect in the plurality of pixels comprises an artifact in the sensor material layer connecting two pixels.

5. The method of claim 1 wherein the defect in the plurality of pixels comprises an artifact in the top electrode layer connecting two pixels.

6. The method of claim 1 wherein the bottom electrode layer comprises chromium.

7. The method of claim 1 wherein the sensor material layer comprises amorphous silicon.

8. The method of claim 1 wherein the top electrode layer comprises Indium Tin Oxide.

9. The method of claim 1 further comprising forming a metal layer over the plurality of pixels.

10. The method of claim 9 wherein the metal layer comprises aluminum.

11. The method of claim 9 further comprising patterning the metal layer using a third photoresist layer to form a plurality of data lines coupled to the plurality of pixels.

12. The method of claim 11 further comprising detecting a defect in the plurality of data lines.

13. The method of claim 12 further comprising patterning the plurality of data lines using a fourth photoresist layer.

14. The method of claim 11 wherein the third photoresist layer comprises a plurality of first patterns and the fourth photoresist layer comprises a plurality of fourth patterns, and wherein at least one of the fourth patterns has an area greater than that of a corresponding third pattern.

15. A method of manufacturing an image sensor device comprising:
providing a glass substrate;

forming a bottom electrode layer over the glass substrate;
forming a sensor material layer over the bottom electrode layer;
forming a top electrode layer over the sensor material layer;
patterning the top electrode layer, the sensor material layer, and the bottom electrode layer using a first photoresist layer to form a plurality of pixels;
forming a metal layer over the plurality of pixels;
patterning the metal layer using a first photoresist layer to form a plurality of data lines coupled to the plurality of pixels;
detecting a defect in the plurality of data lines; and
patterning the plurality of data lines using a second photoresist layer.

16. The method of claim 15 wherein the first photoresist layer comprises a plurality of first patterns and the second photoresist layer comprises a plurality of second patterns, and wherein at least one of the second patterns has an area greater than that of a corresponding first pattern.

17. The method of claim 15 wherein the defect in the plurality of data lines comprises an artifact in the metal layer connecting two data lines.

18. The method of claim 15 wherein the bottom electrode layer comprises chromium.

19. The method of claim 15 wherein the sensor material layer comprises amorphous silicon.

20. The method of claim 15 wherein the top electrode layer comprises Indium Tin Oxide.

\* \* \* \* \*